United States Patent
Sugawara

(10) Patent No.: US 6,488,847 B2
(45) Date of Patent: Dec. 3, 2002

(54) PROCESS AND EQUIPMENT FOR RECOVERING DEVELOPER FROM PHOTORESIST DEVELOPMENT WASTE AND REUSING IT

(75) Inventor: Hiroshi Sugawara, Omiya (JP)

(73) Assignee: Organo Corporation, Tokyo (JP)

(*) Notice: Subject to any disclaimer, the term of this patent is extended or adjusted under 35 U.S.C. 154(b) by 0 days.

(21) Appl. No.: 09/757,368

(22) Filed: Jan. 9, 2001

(65) Prior Publication Data

US 2001/0003481 A1 Jun. 14, 2001

Related U.S. Application Data

(62) Division of application No. 09/392,433, filed on Sep. 9, 1999, now Pat. No. 6,187,519.

(30) Foreign Application Priority Data

Oct. 30, 1998 (JP) .............................. 10-309606

(51) Int. Cl.[7] .............................. C02F 9/02; C02F 9/08; G03C 5/00
(52) U.S. Cl. .................... 210/259; 210/96.1; 210/143; 210/259; 210/263; 210/685; 210/167; 210/195.1; 430/398; 430/399
(58) Field of Search .............................. 210/96.1, 101, 210/143, 167, 670, 681, 685, 686, 688; 137/88, 571, 572; 118/603; 430/398, 399; 366/132, 151.1, 152.1; 222/1, 59, 151, 152

(56) References Cited

U.S. PATENT DOCUMENTS

| 4,606,827 | A | * | 8/1986 | Ernston et al. ............. 210/670 |
| 5,148,945 | A | * | 9/1992 | Geatz ............................. 222/1 |
| 5,330,072 | A | * | 7/1994 | Ferri et al. .................... 222/1 |
| 5,354,434 | A |   | 10/1994 | Satoh et al. .................. 204/72 |
| 5,405,508 | A |   | 4/1995 | Kawakami et al. ......... 204/102 |
| 5,670,340 | A | * | 9/1997 | Juers .......................... 430/399 |
| 5,821,036 | A |   | 10/1998 | Fiener et al. ............... 430/326 |
| 5,874,049 | A | * | 2/1999 | Ferri et al. .................. 366/132 |
| 5,874,204 | A |   | 2/1999 | Sugawara et al. .......... 430/399 |
| 6,083,670 | A | * | 7/2000 | Sugawara et al. .......... 430/399 |

FOREIGN PATENT DOCUMENTS

| GB | 2332957 | 7/1999 |
| JP | 58030753 | 2/1983 |
| JP | 407328642 | 12/1995 |
| JP | 10085741 | 4/1998 |

OTHER PUBLICATIONS

Kokai Hei 5–40345, Feb. 19, 1993, Japan–Abstract.
Derwent of JP Kokai Hei 5–40345, 1993.
PAJ of JP Kokai Hei 5–40345, 1993.

* cited by examiner

Primary Examiner—Joseph W. Drodge
(74) Attorney, Agent, or Firm—Norris McLaughlin & Marcus

(57) ABSTRACT

A tetraalkylammonium hydroxide (TAAH) solution recovered from a development waste through separation therefrom of impurities such as photoresist is mixed with a surface-active substance to have the surface tension thereof adjusted to a desired one, and then reused as a rejuvenated developer. Thus, the surface-active effect (wetting properties) of the rejuvenated developer recovered from the development waste is properly adjusted and controlled, whereby fine photoresist patterns can be stably and effectively developed. Usable surface-active substances include surfactants, and dissolved photoresist contained in the development waste or a photoresist-containing solution such as a photoresist-containing treated solution derived therefrom. Examples of the method of mixing the recovered TAAH-containing solution with the photoresist-containing solution to prepare the rejuvenated developer include a method wherein the TAAH concentration thereof is adjusted either after or while mixing the two solutions, and a method wherein the TAAH concentrations of the two solutions are respectively adjusted, followed by mixing the two solutions at a proper proportion.

16 Claims, 10 Drawing Sheets

PROCESS AND EQUIPMENT FOR RECOVERING DEVELOPER FROM PHOTORESIST DEVELOPMENT WASTE AND REUSING IT

This application is a division of U.S. Ser. No. 09/392,433, filed on Sep. 9, 1999, and now U.S. Pat. No. 6,187,519.

BACKGROUND OF THE INVENTION

1. Field of the Invention

The present invention relates to process and equipment for covering a developer from a photoresist development waste and reusing it, and particularly to process and equipment for recovering a developer from a photoresist development waste, discharged from a process of producing electronic parts such as semiconductor devices (LSI, VLSI, etc.), liquid crystal displays (LCD) or printed boards, or the like, and reusing it.

2. Related Art

In the field of manufacturing electronic parts such as semiconductor devices and liquid crystal displays, and the like, integration scale-up and miniaturization of products have been in rapid progress. For example, the procedure of manufacturing such electronic parts includes a photolithographic process, wherein a photoresist film is formed on a substrate such as a wafer or a glass substrate, predetermined parts of the film are then irradiated with a light or the like, and subsequently the photoresist film is developed with a developer to form a fine pattern. Herein, photoresists include positive photoresists that turn soluble in a developer where exposed to a light or the like, and negative photoresists that turn insoluble in a developer where exposed to a light or the like. In the field of manufacturing electronic parts such as semiconductor devices and liquid crystal displays, positive photoresists are predominantly used. An aqueous solution of a tetraalkylammonium hydroxide (hereinafter often referred to in brief as "TAAH") such as tetramethylammonium hydroxide (hereinafter often referred to in brief as "TMAH") or trimethyl(2-hydroxyethyl)ammonium hydroxide (i.e., choline) as an organic alkali is usually used as a developer for such positive photoresists. Incidentally, although the mainstream developers for the negative photoresists are organic solvent developers, alkali developers may also be used for some negative photoresists.

A photoresist as material to be developed is a hydrophobic substance, and an aqueous solution of TAAH such as TMAH is hydrophilic, whereby the interfacial affinity therebetween is poor. Because of the poor interfacial affinity of the aqueous TAAH solution for the photoresist, effective development of fine patterns is difficult with the aqueous TAAH solution as an ordinary alkali developer. In order to solve this problem, alkali developers containing a surfactant have already been marketed and put into practical use (e.g., developer commercially available under the trade name of "NMD-W" and manufactured by Tokyo Ohka Kogyo Co., Ltd.).

Meanwhile, waste discharged from the development step of using an aqueous TAAH solution as the alkali developer in the photolithographic process (called "photoresist development waste" and hereinafter often referred to in brief as "development waste") usually contains the dissolved photoresist and TAAH, and is hard to render harmless through any treatments. Thus, it is desired to recover and reuse TAAH because of its adverse effects on environment, and various attempts have been made to develop a method of recovering and rejuvenating an alkali developer (hereinafter often referred to as "developer"). Examples of such a method include methods comprising electrodialysis or electrolysis (Japanese Patent Laid-Open No. 7-328642 published on Dec. 19, 1995, and Japanese Patent Laid-Open No. 5-17889 published on Jan. 26, 1993), a method using an anion exchange resin (Japanese Patent Laid-Open No. 10-85741 published on Apr. 7, 1998), a method comprising electrodialysis or electrolysis and using an ion exchange resin(s) (U.S. Pat. No. 5,874,204 patented on Feb. 23, 1999), a method comprising neutralization and electrolysis (Japanese Patent Laid-Open No. 7-41979 published on Feb. 10, 1995), a method using activated carbon (Japanese Patent Laid-Open No. 58-30753 published on Feb. 23, 1983), and a method using a nanofiltration membrane (NF membrane) [Japanese Patent Laid-Open No. 11-192481 published on Jul. 21, 1999].

Since TAAH-containing developers recovered by these methods contain no substantial surface-active substances, however, they are highly hydrophilic solutions. Even where a surfactant is contained in a virgin developer, the recovered TAAH-containing developer has a decreased surfactant concentration, which makes it difficult to secure a surface-active effect comparable to that of the virgin developer, thereby posing a problem that it cannot be reused as a developer in the same development step as it is.

Accordingly, an object of the present invention is to provide process and equipment for recovering a developer from a photoresist development waste and reusing it, which can give a rejuvenated developer capable of stably and effectively developing fine patterns of a photoresist by proper adjustment and control of the surface-active effect (wetting properties) of a TAAH-containing solution recovered from the development waste.

SUMMARY OF THE INVENTION

The present invention provides a process for recovering a developer from a photoresist development waste and reusing it; comprising separating impurities including photoresist from a photoresist development waste for recovering a tetraalkylammonium hydroxide solution, and mixing the recovered tetraalkylammonium hydroxide solution with a surface-active substance.

Since the TAAH-containing developer is hydrophilic as against the hydrophobic photoresist, the interfacial affinity therebetween is so weak that photoresist films become harder to effectively develop not only in the horizontal direction but also in the depthwise direction as the patterns of development become finer. In view of this, there are developers admixed with a surface-active substance such as a surfactant with the aim of weakening the surface tensions of the developers as described before. Meanwhile, the development waste discharged from the development step of using a TAAH-containing developer contains the dissolved photoresist component. This photoresist component has a surface-active effect because it is a water-soluble polymeric substance.

In the conventional methods of recovering and reusing a TAAH-containing developer, however, part or the whole of any surface-active substances including the photoresist component is removed. This will be described below in connection with individual unit operations usable in these methods. (1) Since surface-active substances such as a photoresist and a surfactant, even if endowed with an electric charge, are hardly concentrated in either electrodialysis or electrolysis because these comparatively high molecular weight substances do not migrate through a diaphragm such as an ion exchange membrane. This is particularly true of nonionic surface-active substances, which migrate such a diaphragm only slightly by diffusion. (2) A surface-active substance having an electric charge is removed by an ion exchange resin. (3) Surface-active substances are generally adsorbed on activated carbon. (4) Surface-active substances are removed into concentrate with a nanofilter because they are high in molecular weight.

In view of the foregoing, according to the present invention, the recovered developer stripped of any surface-active substances including the photoresist component is mixed with a suitable amount of a surface-active substance such as a surfactant or the photoresist to adjust the surface tension thereof to a predetermined one, and then reused as a developer.

The usable surface-active substance to be mixed, though varied depending on the development step and the like, may usually be one or a plurality of surface-active substances selected from commercially available surface-active substances such as nonionic, anionic and cationic surfactants. Where a surface-active substance is contained in a virgin developer, the same surface-active substance as contained in that developer is desirably used.

Since the dissolved photoresist component contained in the photoresist development waste also has a surface-active effect, a photoresist-containing solution such as the photoresist development waste or a photoresist-containing treated solution derived therefrom may alternatively be added to the recovered developer (TAAH solution) depleted of any surface-active substance(s) such as the photoresist component to adjust the surface tension thereof to a predetermined level, followed by reusing the resultant rejuvenated developer.

In this case, the photoresist (surface-active substance) concentration can favorably be adjusted and controlled using an ultraviolet-visible light absorptiometer by taking advantage of the fact that the photoresist has absorptions in the ultraviolet and visible light regions (Japanese Patent Laid-Open No. 10-207082 published on Aug. 7, 1998). Of course, however, any apparatuses capable of measuring the photoresist concentration can be used without limitation to ultraviolet-visible light absorptiometers.

Where a TAAH-containing solution recovered by a conventional method or the like is to be mixed with a photoresist-containing solution such as the photoresist development waste or a photoresist-containing treated solution derived therefrom, examples of the method of adjusting the rejuvenated developer, though not particularly limited, include a method wherein the TAAH concentration is adjusted either after or while mixing the recovered TAAH-containing solution with the photoresist-containing solution, and a method wherein the recovered TAAH-containing solution and the photoresist-containing solution are respectively adjusted in TAAH concentration and then mixed at a proper proportion. (Ultra)pure water and/or "TAAH or an aqueous solution thereof" [hereinafter referred to as "TAAH (aqueous solution)"] may be used for adjustment of the TAAH concentration(s).

Where much metallic impurities such as Na, Fe and Al are contained in the photoresist-containing solution, such as the photoresist development waste or the photoresist-containing treated solution derived therefrom, to be mixed with the recovered TAAH-containing solution to impart a surfaceactive effect to the latter, such metallic impurities are preferably removed with a cation exchange resin in the hydrogen ion form (H form) or in the tetraalkylammonium ion form (TAA form) and/or a chelate resin before the photoresist-containing solution is mixed with the recovered TAAH-containing solution.

The photoresist development waste will now be described. The development waste usually contains the dissolved photoresist and TAAH. In general, however, waste (wastewater), which differs from factory to factory, may be mixed with any foreign matter, and may sometimes be mixed with other wastewater as the case may be, whereby part of the hydroxide ions of TAAH may possibly be replaced with other anions to form a salt(s) of tetraalkylammonium (hereinafter often referred to in brief as "TAA"). The foregoing development waste is usually alkaline with a pH value of 12 to 14. The photoresist is dissolved in the form of a salt with TAA ions in the alkaline development waste due to its acid groups such as carboxyl groups and phenolic hydroxyl groups.

Examples of such other anions, which differ from factory to factory, include inorganic anions such as fluoride ions, chloride ions, bromide ions, carbonate ions, hydrogencarbonate ions, sulfate ions, hydrogensulfate ions, nitrate ions, phosphate ions, hydrogenphosphate ions and dihydrogenphosphate ions, and organic anions such as formate ions, acetate ions, and oxalate ions. Carbonate ions and hydrogencarbonate ions may often exist in small amounts because carbon dioxide gas in the air is liable to dissolve in the development waste. Additionally stated, since the counter ions of TAA ions in concentrate obtained through electrolysis as described later are usually hydroxide ions, incorporation of at least an electrolysis step into the method of recovering a TAAH solution will suffice when the amount of anions other than hydroxide ions is so large that a difficulty is encountered in reusing the resultant TAAH solution as a photoresist alkali developer.

Examples of TAAH in the development waste, which is an alkali used in the photoresist developer for use in production of various electronic parts and the like, include tetramethylammonium hydroxide (TMAH), tetraethylammonium hydroxide, tetrapropylammonium hydroxide, tetrabutylammonium hydroxide, methyltriethylammonium hydroxide, trimethylethylammonium hydroxide, dimethyldiethylammonium hydroxide, trimethyl(2-hydroxyethyl)ammonium hydroxide (i.e., choline), triethyl(2-hydroxyethyl) ammonium hydroxide, dimethyldi(2-hydroxyethyl) ammonium hydroxide, diethyldi(2-hydroxyethyl) ammonium hydroxide, methyltri(2-hydroxyethyl) ammonium hydroxide, ethyltri(2-hydroxyethyl)ammonium hydroxide, and tetra(2-hydroxyethyl)ammonium hydroxide (the former two and choline in particular).

Various methods can be mentioned as the method of separating impurities such as photoresist from a development waste to recover a TAAH solution. Preferred is a method comprising subjecting the development waste to at least one step selected from among a concentration and refining step (A) of concentrating and refining TAAH by at least one of electrodialysis and electrolysis (Japanese Patent Laid-Open No. 7-328642 and Japanese Patent Laid-Open No. 5-17889, incorporated herein by reference in their entirety), an ion exchange treatment step (B) of contact treatment with an anion exchanger (preferably an anion exchange resin desirably in the OH form in an aspect of refining) or with the above-mentioned anion exchanger and a cation exchange resin in one of the H form and the TAA form (Japanese Patent Laid-Open No. 10-85741 and U.S. Pat. No. 5,874,204, incorporated herein by reference in their entirety), and an NF membrane separation treatment step (C) of obtaining permeate mainly containing TAAH by treatment with a nanofiltration membrane (NF membrane) [Japanese Patent Laid-Open No. 11-192481, incorporated herein by reference in its entirety once laid open although it has not yet been published]. When a plurality of such steps are taken, the order thereof may be arbitrary, and any proper order thereof may be chosen, for example, in accordance with the purpose. The steps (A), (B) and (C) can all remove impurities as steps of refining the development waste or a TAAH-containing treated solution derived therefrom. Among them, the step (B) in particular is a desirable step for removing impurities as much as possible, and the step (A) can concentrate TAAH.

A concentration step of concentrating TAAH by at least one of reverse osmosis treatment and evaporation may be taken though it is not a step capable of refining the development waste or the TAAH-containing treated solution derived therefrom unlike the concentration and refining step (A). Since the development waste is usually lowered in TAAH concentration with washing water (rinse water) and the like, a concentration step of concentrating TAAH from the development waste or the TAAH-containing treated solution derived therefrom by at least one of reverse osmosis treatment, evaporation, electrodialysis, electrolysis, etc. is preferably incorporated into the method of recovering a TAAH solution. Reverse osmosis treatment and evaporation concentrate TAAH concurrently with impurities such as photoresist, whereas electrodialysis and electrolysis are characterized by heightening the TAAH purity since impurities such as photoresist are not substantially concentrated simultaneously.

Where a plurality of such concentration methods are used in combination, the order thereof is not particularly limited but may be arbitrary. For example, however, when reverse osmosis membrane treatment and/or evaporation is followed by electrodialysis and/or electrolysis, there can be obtained advantages such as an improvement in current efficiency during electrodialysis and/or electrolysis, miniaturization and running cost reduction of an electrodialysis and/or electrolysis unit(s) due to a decrease in the amount of the solution to be treated therewith, lowering of a voltage to be applied to such a unit(s), and an improvement in TAAH recovery (U.S. Pat. No. 5,874,204). When the ion exchange treatment step (B) and/or the NF membrane separation treatment step (C) is also taken in this case, this evaporation and/or reverse osmosis membrane treatment step may be taken at any stage, e.g., at first, later or between both. Incidentally, since either condensed water obtained by evaporation or permeate water obtained by reverse osmosis membrane treatment does not substantially contain the photoresist and TAAH, the water can be used as process water or the like. In the case of reverse osmosis membrane treatment, the solution to be treated thereby preferably has a pH value of 9 to 12 from the standpoint of minimizing the deterioration of a reverse osmosis membrane.

From the standpoint of obtaining a high-purity rejuvenated developer, the anion exchanger for use in the step (B) is preferably an anion exchange resin, especially desirably an anion exchange resin in the OH form, which is desirably used in combination with a cation exchange resin in at least one of the H form and the TAA form, which can remove impurities such as Na. Other anion exchanger may sometimes be used instead of the anion exchange resin.

Incidentally, when the development waste or the TAAH-containing treated solution derived therefrom [e.g., TAAH solution obtained from the step (A) and/or (C)] is brought into contact with the anion exchange resin, the photoresist in the waste or the treated solution thereof can be highly selectively adsorbed on the anion exchange resin despite the coexistence of competitive hydroxide ions derived from TAAH. The reason for this is believed to be as follows: The mainstream alkali-developable photoresists are those having a novolak resin as the matrix resin. This novolak resin has a large number of benzene rings. When a styrene type anion exchange resin having benzene rings or the like resin in particular is, for example, used as the anion exchange resin, it is believed that the photoresist can be efficiently and highly selectively removed due to affinity (hydrophobic) interaction between the respective benzene rings of the anion exchange resin and the photoresist in addition to the mutual electrostatic interaction thereof.

The NF membrane separation treatment step (C) may be taken in multiple stages (Japanese Patent Laid-Open No. 11-192481). In the step (C), concentrate mainly containing impurities such as photoresist is obtained together with permeate mainly containing TAAH. The NF membrane to be used in the step (C) is a separation membrane having a molecular cutoff falling within the range of 100 to 1,000 and characterized by a sodium chloride rejection of at most 90% when a 0.2% (wt./vol.) aqueous solution of sodium chloride as a solution to be treated is subjected to separation treatment with the membrane at 25° C.

When the development waste or a TAAH-containing solution derived therefrom is treated with the NF membrane, most of TAAH permeates through the NF membrane to enter the permeate, while little or a little photoresist permeates through the NF membrane to remain mostly in the concentrate, wherein the photoresist is therefore concentrated. Further, some impurities such as metal components including Fe and Al, and silica, which are hard to remove in the ion exchange treatment step (B), can be removed into the concentrate because they little permeate through the NF membrane.

Since the permeate stripped of most of impurities is obtained in the NF membrane separation treatment step (C), the load of impurities can be decreased in any later step(s) such for example as the ion exchange treatment, electrodialysis and/or electrolysis step, if taken, to reduce the refining cost. Incidentally, the NF membrane separation treatment step (C) is inexpensive and easy of operation.

Examples of other step that may be incorporated into the method of separating impurities such as photoresist from a development waste to recover a TAAH solution include an activated carbon treatment step of bringing a development waste or a TAAH-containing treated solution derived therefrom into contact with activated carbon to remove the photoresist (Japanese Patent Laid-Open No. 58-30753, incorporated herein by reference in its entirety), and a chelate resin treatment step of bringing a development waste or a TAAH-containing treated solution derived therefrom into contact with a chelate resin to remove some metal impurities such as Fe and Al [Japanese Patent Application No. 10-265581 (i.e., 265,581/1998), incorporated herein by reference in its entirety once laid open although it has not yet been published]. Such other step(s) may be combined with at least one of the aforementioned steps, in which case the order thereof may be arbitrary.

Other methods of separating impurities such as photoresist from a development waste to recover a TAAH solution include methods wherein a development waste is subjected to a neutralization+solid-liquid separation step, a step of decomposing organics with ozone, hydrogen peroxide or ultraviolet ray irradiation, and an electrolysis concentration step in this order (Japanese Patent Laid-Open No. 4-41979 published on Jul. 12, 1992, Japanese Patent Laid-Open No. 5-17889 published on Jan. 26, 1993, and Japanese Patent Laid-Open No. 5-106074 published on Apr. 27, 1993, incorporated herein by reference in their entirety), and a method wherein a development waste is subjected to a neutralization+solid-liquid separation step and an electrolysis concentration step in this order. In such cases, most of the photoresist is removed by neutralization+solid-liquid separation, and a TAA salt formed by neutralization turns back to TAAH with the aid of electrolysis. When the purity of the TAAH-containing solution obtained by any method as mentioned above is insufficient, at least one of the aforementioned steps (A), (B) and (C), the chelate resin treatment step, and so on may be taken as a later step(s). When the TAAH-containing solution is low in TAAH concentration, an evaporation and/or reverse osmosis membrane treatment step may be taken as a later step(s).

The principle of electrodialysis that may be effected as the step (A) will now be described while referring to FIG. 9. Incidentally, the description will be made of an ordinary case where TAA ions have hydroxide ions (OH$^-$, hereinafter referred to as "OH ions") as the counter ions.

As shown in FIG. 9, cation exchange membranes 103 and anion exchange membranes 104 are arrayed alternately with each other between a cathode 101 and an anode 102 to form a plurality of cells. TAAH in a starting solution (development waste or TAAH-containing solution derived therefrom) containing TAAH and photoresist (R), and sent to the cells dissociates into TAA ions (TAA$^+$) as cations and OH ions as anions. When a DC electric current is applied between the cathode 101 and the anode 102, therefore, TAA ions are transferred toward the cathode across a cation exchange membrane 103 but substantially blocked by an anion exchange membrane 104 next thereto, while OH ions are transferred toward the anode across an anion exchange membrane 104 but substantially blocked by a cation exchange membrane 103 next thereto. Thus, TAAH is concentrated in a given cell, while TAAH is depleted in cells adjacent to that cell. More specifically, a cell (A) having an anion exchange membrane 104 facing the cathode 101 functions as a concentrating cell wherein TAAH is concentrated to form concentrate, while a cell (B) having an anion exchange membrane 104 facing the anode 102 functions as a desalting cell wherein TAAH is depleted to form a desalted solution. Since the photoresist (R) in the starting solution hardly moves across the ion exchange membranes, the photoresist (R) is passed substantially as such through every concentrating cell and every desalting cell to remain in the concentrate and the desalted solution.

As is apparent from the foregoing, when the starting solution is passed through both the desalting cells and the concentrating cells as shown in FIG. 9, the photoresist (R) remains intact in the concentrate, and only TAAH is concentrated in the concentrating cells without concentration therein of the photoresist (R), whereby the photoresist concentration of the concentrate is almost the same as that of the starting solution. In this respect, electrodialysis is definitely different from evaporation and reverse osmosis wherein not only TAAH but also impurities such as photoresist are concentrated.

Where a high-purity TAAH solution reutilizable as a photoresist alkali developer is to be regenerated and recovered, a concentrate not substantially containing various impurities is preferably obtained through electrodialysis. For that purpose, it is preferred that (ultra)pure water or a solution of an electrolyte such as a low-concentration TAAH solution free of various impurities (e.g., a solution prepared by dissolving a small amount of virgin TAAH in pure or ultrapure water) be passed through the concentrating cells while passing the starting solution through the desalting cells. Where the starting solution is passed through the concentrating cells as well, however, an advantage is gained in respect of a decrease in the amount (volume) of wastewater discharged as desalted waste. In order to obtain a high-purity TAAH solution with a decrease in the amount of wastewater discharged as desalted waste, there also is preferably used such a method that permeate obtained by treating the starting solution containing TAAH and photoresist with an NF membrane be sent to concentrating cells while sending the starting solution or concentrate obtained through treatment thereof with the NF membrane to desalting cells. In any case, the desalted solution obtained by electrodialysis may be used as a source of photoresist as a surface-active substance either as such or after proper refining treatment thereof such as ion exchange resin treatment and/or chelate resin treatment if necessary.

The electrodialysis unit may be one as is generally used. Examples of ion exchange membranes to be used in this unit, though not particularly limited in so far as capable of selectively separating either cations or anions, include ACIPLEX (registered trademark of products manufactured by Asahi Chemical Industry Co., Ltd.), SELEMION (registered trademark of products manufactured by Asahi Glass Co., Ltd.), NEOSEPTA (registered trademark of products manufactured by Tokuyama Soda Co., Ltd.), IonClad (registered trademark) electrically driven separation membranes (manufactured by Pall Company), and Nafion (registered trademark of products manufactured by E. I. du Pont de Nemours and Company). Properties of ion exchange membranes may be typical.

The structure of the electrodialysis unit is not particularly limited. For example, a plurality of cation exchange membranes and a plurality of anion exchange membranes may be stacked alternately with each other while maintaining appropriate intervals therebetween with gaskets provided either with an inflow port and an outflow port for a desalting solution, or with an inflow port and an outflow port for a concentrating liquid to form a plurality of cells, which are interposed between a pair of electrodes to construct an electrodialyzer.

The electrodialysis unit is not limited to the above-mentioned typical structure, but may alternatively be constructed in such a way that bipolar membranes are each disposed as diaphragms between the cation exchange membranes and the anion exchange membranes, for example, as disclosed in Japanese Patent Laid-Open No. 6-299,385 published on Oct. 25, 1994 (incorporated herein by reference in its entirety).

As for the electrodes used herein, examples of the anode include those made of nickel, carbon, stainless steel or the like, and titanium electrodes coated with platinum or iridium, while examples of the cathode include those made of stainless steel, nickel or the like, and titanium electrodes coated with platinum or iridium. The anode and the cathode may be in any form, examples of which include a plate, a rod, a net, a porous plate.

Herein, neutral membranes such as polyvinyl alcohol membranes or hydrophilized porous Teflon (registered trademark of products manufactured by E. I. du Pont de Nemours and Company) membranes, which have a superior alkali resistance to that of anion exchange membranes, may be used instead of the anion exchange membranes. The neutral membranes, which are simple polymer membranes free of ionic functional groups, allow TAA ions to pass thereacross, but are lower in permeability thereto than cation exchange membranes. In this case, therefore, a difference in transference number between the neutral membranes and the cation exchange membranes is taken advantage of, whereby TAA ions can be concentrated by electrodialysis. When the neutral membranes are used instead of the anion exchange membranes, however, the current efficiency is worse than that in the case of the anion exchange membranes.

Examples of the foregoing electrodialysis, which may be done batch-wise, semi-batch-wise or continuously, include not only a single-stage method, but also a circulation method and a multi-stage treatment method as disclosed in Japanese Patent Laid-Open No. 7-328642 (incorporated herein by reference in its entirety).

The principle of electrolysis that may be effected as the step (A) will now be described while referring to FIG. 10. Incidentally, the description will be made of an ordinary case where TAA ions have OH ions as the counter ions.

As shown in FIG. 10, a cation exchange membrane 123 is disposed between a cathode 121 and an anode 122 to form a cathode cell (C) and an anode cell (D). In principle, the cation exchange membrane allows only cations to pass thereacross [actually, however, anions including photoresist (R$^-$) and the like are slightly passed thereacross]. A starting solution (development waste or TAAH-containing solution derived therefrom) is passed through the anode cell (D), while (ultra)pure water, a solution of an electrolyte such as a low-concentration TAAH solution free of various impurities (e.g., a solution prepared by dissolving a small amount of virgin TAAH in pure or ultrapure water), or the like is passed as a concentrating liquid through the cathode cell (C). Since TAAH in the starting solution dissociates into TAA ions (TAA$^+$) and OH ions (OH$^-$), TAA ions as cations are transferred toward the cathode (−) to enter the cathode cell (C) across the cation exchange membrane 123 when a DC electric current is applied between the cathode 121 and the anode 122. On the cathode 121, hydrogen ions (H$^+$) from water (H$_2$O$\leftarrow\rightarrow$H$^+$+OH$^-$) receive electrons (e$^-$) to generate hydrogen gas (H$^+$), while residual OH ions (OH$^-$) as anions become counter ions of TAA ions entering the cathode cell (C) from the anode cell (D) to form TAAH. Thus, TAAH is concentrated in the cathode cell (C) in keeping with progress of electrolysis. In this sense, the cathode cell (C) functions as a concentrating cell. On the other hand, on the anode 122, OH ions (OH$^-$) of TAAH release electrons (e$^-$) to become oxygen gas (O$_2$) and water. In this sense, the anode cell (D) functions as a desalting cell wherein a desalted solution ("dilute solution" depleted of TAA ions) is formed.

The desalted solution obtained by electrolysis may be used as a source of photoresist as a surface-active substance either as such or after proper refining treatment thereof such as ion exchange resin treatment and/or chelate resin treatment.

Additionally stated, if ionic species such as Cl$^-$ or Br$^-$, which is more liable to undergo electrolysis than OH$^-$, is contained in the starting solution, a gas such as Cl$_2$ or Br$_2$ is generated. In this case, further division of the anode cell with an anion exchange membrane with addition of an alkaline substance such as ammonium hydroxide to a sectional cell on the anode's side can prevent generation of a gas such as Cl$_2$ or Br$_2$ through neutralization as disclosed in Japanese Patent Laid-Open No. 57-155390 published on Sep. 25, 1982 (incorporated herein by reference in its entirety). On the other hand, SO$_4^{2-}$ and NO$_3^-$ undergo electrolysis less easily than OH$^-$, so that they remain in the form of H$_2$SO$_4$, HNO$_3$, etc. with electrolysis of OH$^-$ involving generation of O$_2$.

Two neutral membranes such as hydrophilized porous Teflon membranes may alternatively be used instead of the cation exchange membrane to provide an anode chamber, a middle chamber and a cathode chamber, wherein electrolysis can be effected by passing the starting solution through the middle chamber (Japanese Patent Laid-Open No. 60-247641 published on Dec. 7, 1985, incorporated herein by reference in its entirety).

When a higher-purity TAAH concentrate is desired to be obtained, a plurality of (preferably two) cation exchange membranes may be disposed between the cathode and the anode. In this case, the starting solution is passed through a cell on the anode's side (anode cell), while a concentrating liquid (liquid for recovery therein of TAAH) such for example as (ultra)pure water or a solution of an electrolyte such as a low-concentration TAAH solution free of various impurities (e.g., a solution prepared by dissolving a small amount of virgin TAAH in pure or ultrapure water) is passed through a cell on the cathode's side (cathode cell) and the middle cell, whereby TAAH can be refined in multiple stages to obtain a high-purity TAAH concentrate from the cathode cell.

As for the electrodes used in the electrolysis, those made of the same materials as in the electrodialysis can be used. Examples of the electrolysis, which may be done batch-wise, semi-batch-wise or continuously, include a single-stage method, a circulation method, and a multi-stage treatment method as described before in connection with electrodialysis.

Additionally stated, the terms "concentrate" and "desalted solution" used herein are used to indicate whether the TAAH content is increased or decreased, and not to indicate which is higher or lower in TAAH concentration.

Examples of the anion exchange resin (desirably in the OH form) that may be used in the step (B) include styrene, acrylic or like type anion exchange resins in a fibrous, granular or like form, which are preferred in an aspect of treatment efficiency, and which may be used either alone or in the form of a mixture or a stratified structure of a plurality thereof at an arbitrary proportion. As described before, however, styrene type anion exchange resins are especially preferred in an aspect of photoresist removal efficiency. Incidentally, acrylic type anion exchange resins are those obtained by crosslinking (meth)acrylic acid and an ester(s) thereof with divinylbenzene (DVB) or the like. Strongly basic anion exchange resins are preferred in an aspect of photoresist removal efficiency although weakly basic anion exchange resins and medium base anion exchange resins can also be used.

Examples of the cation exchange resin in the H or TAA form that may be used in the step (B) include styrene, acrylic or like type cation exchange resins in a fibrous, granular or like form, which are preferred in an aspect of treatment efficiency, and which may be either weakly acidic or strongly acidic. They may be used either alone or in the form of a mixture or a stratified structure of a plurality thereof at an arbitrary proportion.

Commercially available cation exchange resins are usually in the H or Na form. Such a cation exchange resin (preferably converted into the H form if originally in the Na form) may preliminarily be converted into the TAA form before service thereof to prevent occurrence of a phenomenon that TAAH is adsorbed on the cation exchange resin in the initial stage of solution passage through the cation exchange resin to lower the TAAH concentration of the resultant treated solution. More specifically, a cation exchange resin is used preferably after converted into the TAA form though it can be used in the H form as it is. However, the cation exchange resin not completely in the TAA form but partially in the H form may also be used, or both of a cation exchange resin in the H form and a cation exchange resin in the TAA form may alternatively be used in the form of either a mixture or a stratified structure at an arbitrary proportion.

Use of either the anion exchange resin or the cation exchange resin alternately treated with an aqueous alkali solution and an aqueous acid solution and then well washed with (ultra)pure water is preferred in order to make it free from any matter that may be leached out therefrom during the service thereof.

Which one of an anion exchange resin and a cation exchange resin, or both to use as the ion exchange resin may be determined based on the permissible amounts of various impurities such as anions and cations that may remain in a TAAH solution to be recovered in connection with a use of that solution. In the case where the recovered TAAH solution, after mixed with a surface-active substance, is used as a developer for use in production of electronic parts such for example as semiconductor devices, liquid crystal displays and printed boards as described before, however, both of the anion exchange resin and the cation exchange resin are desirably used.

When both of an anion exchange resin and a cation exchange resin are used as the ion exchange resin, the anion exchange resin and the cation exchange resin may be mixed with each other and used in the form of a mixed ion exchange resin packed in a column or a tower, but are preferably used in the form of a stratified structure packed in a column or a tower, wherein the anion exchange resin is disposed on the upstream side of the cation exchange resin disposed on the downstream side. When the development waste is preliminarily subjected to a multi-stage electrodialysis treatment or the like to make the concentrate have the photoresist remaining little, or when the original development waste contains only a slight amount of photoresist, however, the cation exchange resin may be disposed on the upstream side of the anion exchange resin disposed on the downstream side. An upstream column or tower packed with the anion exchange resin may alternatively be disposed separately from but used in connection with a downstream column or tower packed with the cation exchange resin. In this case, only one of the anion and cation exchange resins, when lowered in ion exchange capacity or deteriorated through long-time service, can conveniently be easily replaced with the virgin one. In the foregoing case of separate columns or towers, other treatment unit may be disposed between the two columns or towers.

An advantage involved in the case where the anion exchange resin is disposed on the upstream side of the cation exchange resin disposed on the downstream side is that, since it is conceivable that a trace amount of an amine may be leached out from the anion exchange resin, this leached-out amine, if any, can be trapped on the cation exchange resin disposed on the downstream side.

Examples of the NF membrane that may be used in the step (C) include NTR-7410, NTR-7450, NTR-725HF, NTR-7250, NTR-729HF, and NTR-769SR manufactured by NITTO DENKO CORPORATION; SU-200S, SU-500, and SU-600 manufactured by Toray Industries, Inc.; NF-45, NF-55, NF-70, and NF-90 manufactured by FilmTec Corporation; DESAL-5L and DESAL-5K manufactured by Desal Co. Limited; TS-80 manufactured by TrySep Corporation; TFC-S manufactured by Fluid Systems; and MPF-34, MPF-36, MPT-34, MPT-36, MPS-34 and MPS-36 of Sel RO (registered trademark) series manufactured by Koch Membrane Systems, Inc.

An NF membrane having a surface thereof charged negative is preferably used as a membrane principally aimed at separation and removal of photoresist into the concentrate. Since the photoresist usually exists in the anionic form in the development waste or the TAAH-containing treated solution derived therefrom [e.g., TAAH-containing solution treated in the step (A) and/or (B)], the use of the NF membrane having a surface thereof charged negative improves the rejection against the photoresist and hardly brings about fouling (contamination) of the NF membrane otherwise attributed to attachment thereto of the photoresist. In this case, an anionic surfactant, when contained in the development waste or the TAAH-containing treated solution derived therefrom, can also be effectively separated and removed into the concentrate. Further, in general, the NF membrane is also capable of separating and removing a nonionic surfactant, a cationic surfactant, etc. into the concentrate. Needless to say, an NF membrane having a surface thereof charged positive or a neutral NF membrane may also be used in accordance with properties of the development waste or the TAAH-containing treated solution derived therefrom (e.g., the kind of surfactant, if contained therein). The concentrate containing the photoresist and/or a surfactant and thus separated with the NF membrane may be used as a source of surface-active substance either as such or after proper refining treatment thereof such as ion exchange resin treatment and/or chelate resin treatment if necessary.

In general, the NF membrane is comparatively weak against a high-pH solution. In order to prolong the life span of the NF membrane, the pH of a solution to be treated therewith is desired to be adjusted to a value of 9.5 to 12 if necessary, and preferably to a value of 9.5 to 11, to which the pH is, however, not limited in so far as the use of the NF membrane is well costeffective. It is preferred to provide a safety filter of at most 25 $\mu$m in pore size in front of the NF membrane in order to avoid a fear of clogging of the NF membrane with fine impurity particles and the like. This applies at whatever stage the step (C) of separation with the NF membrane is taken. Care must also be taken because the increasing TAAH concentration of the solution being treated with the NF membrane raises the operating pressure of a nanofilter and shortens the life span of the NF membrane with an increase in pH.

When a large amount of TAAH is still contained in the concentrate obtained in the step (C), a variety of refining step(s) for improving the TAAH recovery may be taken at a later stage(s), whereby the concentrate can be refined either to some degree of purification commensurate with the application of the rejuvenated developer or to such a high degree of purification that the rejuvenated developer can be reused in electronic part production processes and the like as the case may be.

Since the permeate obtained in the step (C) (hereinafter often referred to as the "NF permeate") is a TAAH solution having a considerably high purity, it may advantageously be passed as a concentrating liquid (liquid for recovery therein of TAAH) through the concentrating cell(s) of an electrodialysis or electrolysis unit, while the concentrate obtained in the step (C) (hereinafter often referred to as the "NF concentrate") may be passed as a starting solution (solution to be depleted of TAAH) through the desalting cell(s) of the electrodialysis or electrolysis unit, if the NF concentrate contains a considerable amount of TAAH remaining therein (Japanese Patent Laid-Open No. 11-192481). In this case, since the NF permeate is used instead of (ultra)pure water as the concentrating liquid, the amount of wastewater discharged as desalted waste can advantageously be decreased. Further, the amount of TAAH to be transferred into the concentrating liquid by electrodialysis or electrolysis can advantageously be decreased to reduce the running cost and miniaturize the unit. When the wastewater discharged as desalted waste from the electrodialysis or electrolysis unit is a solution having a high photoresist and/or surfactant concentration, it may be used as a source of surface-active substance either as such or after a proper refining step as described above if necessary.

For example, when a refining step(s) such as the ion exchange treatment, electrodialysis and/or electrolysis step is taken, it is preferred that such a step(s) be taken after the step (C) of separation with the NF membrane, if taken, rather than before the step (C) from the standpoint of decreasing the load on a refining unit(s) for use in such a refining step(s) because the purity of the NF permeate is considerably high. For example, in the case where the step (C) is aimed at removing a slight amount of impurities (particularly some metal components including Fe and Al, and silica, which are hard to remove by ion exchange treatment, and the like), however, the refining step(s) such as the ion exchange treatment, electrodialysis and/or electrolysis step may be taken before the step (C). Needless to say, such refining steps may optionally be taken both before and after the step (C). In the case where the impurity concentration of the original development waste is low, in the case where the use of the rejuvenated developer is such that a low purity thereof is tolerable, or in the like case, the NF permeate may alternatively be subjected to at least one of evaporation, reverse osmosis membrane treatment, electrodialysis and electrolysis for concentration of TAMH, and/or to adjustment of the TAAH concentration by addition thereto of a virgin conc. TAAH solution, or the like after the step (C) without ion exchange treatment.

Examples of the chelate resin usable in the chelate resin treatment step include iminodiacetic acid type, iminopropionic acid type, aminophosphonic acid type (e.g., aminomethylenephosphonic acid type), polyamine type, glucamine type (e.g., N-methylglucamine type), aminocarboxylic acid type, dithiocarbamic acid type, thiol type, amidoxime type, and pyridine type chelate resins, among which iminodiacetic acid type, iminopropionic acid type, aminomethylenephosphonic acid type, polyamine type, N-methylglucamine type chelate resins are preferred. An example of the iminodiacetic acid type chelate resins is AMBERLITE (registered trademark) IRC-718 manufactured by Rohm and Haas Company, an example of the iminopropionic acid type chelate resins is EPOROUS MX-8 manufactured by Miyoshi Oil & Fat Co., Ltd., an example of the aminomethylenephosphonic acid type chelate resins is DUOLITE (registered trademark) C-467 manufactured by Rohm and Haas Company, examples of the polyamine type chelate resins include SUMICHELATE (registered trademark) MC-10 manufactured by Sumitomo Chemical Co., Ltd. and DIAION (registered trademark) CR-20 manufactured by Mitsubishi Chemical Corporation, and an example of the N-methylglucamine type chelate resins is AMBERLITE IRA-743 manufactured by Rohm and Haas Company.

A trace amount of impurities, which pose a problem when the rejuvenated developer is reused, is polyvalent metallic ions [Fe(II), Fe(III), Al(III), etc.]. Since the chelate resin is highly selective for polyvalent metallic ions, treatment of contacting the chelate resin with the development waste or a TAAH-containing solution derived therefrom can effectively remove such polyvalent metallic ions. The chelate resin may also be used for the purpose of removing the above-mentioned polyvalent metallic ions from a photoresist-containing solution such as the development waste or a photoresist-containing treated solution derived therefrom, which may be used as a source of surface-active substance. The used chelate resin is regenerated for its reuse by treating the chelate resin with an acid such as hydrochloric acid for formation of a chelate resin in the H form and washing away the acid with (ultra)pure water, and preferably converting it into a chelate resin in the TAA form with an aqueous TAAH solution.

In an aspect of removal of impurities, it is preferred to use the chelate resin in combination with the ion exchange resin. The chelate resin may be used either before or after use of the ion exchange resin, and they may be used in the form of either single beds (separate beds) or a mixed bed. Any combination of chelate resin+anion exchange resin, chelate resin+anion exchange resin+cation exchange resin or chelate resin+cation exchange resin will suffice for the purpose of heightening the purity of a recovered TAAH solution. A combination of chelate resin+cation exchange resin is preferred for the purpose of heightening the purity of a photoresist-containing solution as a source of surface-active substance. Incidentally, in combining the chelate resin with both kinds of ion exchange resins, the order thereof may be anion exchange resin (cation exchange resin)→chelate resin→cation exchange resin (anion exchange resin).

When the chelate resin and the ion exchange resin are used for heightening the purity of a TAAH solution in the course of obtaining the rejuvenated developer, use of an NF membrane in advance thereof is preferred in order to lower the load on the chelate resin and the ion exchange resin. An NF membrane may be used after use of the chelate resin and the ion exchange resin for the purpose of further heightening the purity of a TAAH solution.

In equipment (system) for carrying out the present invention, water tanks provided if necessary and aimed at storing or retaining any solutions containing at least TAAH are preferably constructed in such a way that they are purged with an inert gas such as nitrogen gas or argon gas (Japanese Patent Laid-Open No. 10-165933 published on Jun. 23, 1998, incorporated herein by reference in its entirety). In this case, the water tanks are more preferably constructed in such a way that the inert gas pressure therein can be maintained higher than the atmospheric pressure, and especially preferably constructed in such a way that a water-sealing unit is attached to each of the water tanks purged with the inert gas. These provisions prevent strongly alkaline TAAH (TAA$^+$ OH$^-$) from being converted into a tetraalkylammonium hydrogencarbonate (TAA$^+$HCO$_3^-$) and/or a tetraalkylammonium carbonate [(TAA$^+$)$_2$CO$_3^{2-}$] due otherwise to dissolution of carbon dioxide gas (CO$_2$) in the atmosphere into a TAAH-containing solution through contact therebetween, and prevent other impurities in the atmosphere (various gases such as acidic gases other than CO$_2$ and oxidizing gases, dust, dirt, metals, salts, etc.) from mixing in that solution. When the development waste or a photoresist-containing treated solution derived therefrom is used as a source of surface-active substance to be added to the recovered TAAH solution, the same measure is preferably taken for the purpose of preventing impurities in the atmosphere from mixing therein. This is particularly desired when the rejuvenated developer is to be used as a developer for use in production of electronic parts such as semiconductor devices.

If necessary, an analytical controller(s) including a quantitative determination apparatus for the photoresist concentration of the development waste and/or a variety of TAAH-containing treated solution or photoresist-containing treated solution thereof [e.g., absorption spectrometer, or (ultraviolet-visible light) absorptiometer], and, if necessary, a quantitative determination apparatus for the TAAH concentration thereof (e.g., pH-metric titrating apparatus, potentiometric titrating apparatus, conductivity meter, or ultrasonic concentration meter) may favorably be provided at a suitable position(s) in equipment (system) for carrying out the process of the present invention (Japanese Patent Laid-Open No. 10-207082 published on Aug. 7, 1998, incorporated herein by reference in its entirety). If further necessary, a temperature controller(s) having at least a cooling function may be provided at a suitable position(s), while a TAAH concentration controller may be provided around the terminal of the system favorably to enable the resultant rejuvenated developer to be fed directly to a development unit (Japanese Patent Laid-Open No. 11-128691 published on May 18, 1999, incorporated herein by reference in its entirety).

When a suitable amount of TAAH and/or (ultra)pure water is added to the recovered TAAH solution before service of it as a rejuvenated developer in the development step, use can be made of a TAAH concentration determination apparatus such for example as a pH-metric titrating apparatus, a potentiometric titrating apparatus, a conductivity meter or an ultrasonic concentration meter, preferably a conductivity meter or an ultrasonic concentration meter. Incidentally, the conductivity meter makes the most of the fact that the TAAH concentration can be measured in dominantly linear correlation thereof with the conductivity around the serviceable TAAH concentration. On the other hand, the ultrasonic concentration meter is a determination apparatus whereby the concentration of a solution is found through measurement of ultrasonic wave propagation rate and temperature by making the most of the facts that the ultrasonic wave propagation rate through the solution, and the density and bulk modulus of the solution have a fundamental relation, and that the bulk modulus and density of the solution depend on the concentration and temperature of the solution.

A membrane treatment unit may further be provided at or near the terminal of the system for carrying out the present invention. In this case, fine particles that exist in the development waste from the beginning, and fine particles that may mix therein from pumps, an electrodialysis and/or electrolysis unit, a chelate resin, an ion exchange resin, etc., if any, can favorably be removed for certain. This may be applicable either to the recovered TAAH solution or to the photoresist-containing treated solution, but is preferably applied to the rejuvenated developer before it is sent to the development step.

Examples of such a membrane treatment unit include a microfiltration membrane unit wherein use is made of a polyethylene (PE), polypropylene (PP) or polytetrafluoroethylene (PTFE) membrane filter having micropores of about 0.03 to 1 $\mu$m in diameter, and an ultrafiltration membrane unit. A suitable membrane treatment unit may be chosen and used in accordance with the purpose of treatment. A nano-filter may alternatively be used instead of the above-mentioned membrane treatment units.

According to the present invention, as a suitable example of equipment for performing the process of the present invention, there is provided equipment for recovering a developer from a photoresist development waste and reusing it; characterized by comprising a recovery and refining unit for separating impurities including photoresist from a photoresist development waste to recover a tetraalkylammonium hydroxide solution, and a rejuvenated developer adjustment unit for mixing the tetraalkylammonium hydroxide solution recovered from the recovery and refining unit with part of the photoresist development waste preferably treated with a cation exchange resin and/or chelate resin treatment unit and/or at least part of a photoresist-containing waste recovered from the recovery and refining unit and preferably treated with a cation exchange resin and/or chelate resin treatment unit, and optionally replenishing them with (ultra)pure water and/or tetraalkylammonium hydroxide as needed to obtain a rejuvenated developer, which is fed to a development unit. Herein, the "recovery and refining unit" comprises at least one of units for use in various steps as mentioned hereinabove in connection with the method of separating impurities such as photoresist from a development waste to recover a TAAH solution. Using this developer recovery and reuse equipment, a developer can be recirculated and reused in a factory.

This developer recovery and reuse equipment desirably further comprises a circulation line attached to the rejuvenated developer adjustment unit and provided with a photoresist concentration determination apparatus for the rejuvenated developer and a TAAH concentration determination apparatus for the rejuvenated developer, and a controller for controlling to desired values the flow rates of the recovered TAAH solution, part of the photoresist development waste preferably treated with the cation exchange resin and/or chelate resin treatment unit and/or at least part of the photoresist-containing waste recovered from the recovery and refining unit and preferably treated with the cation exchange resin and/or chelate resin treatment unit, and (ultra)pure water and/or TAAH (aqueous solution) through operation of the measured values of photoresist concentration and TAAH concentration as input data. This enables automatic recirculation and reuse of the developer in a factory.

According to the present invention, as another suitable example of equipment for performing the process of the present invention, there is provided equipment for recovering a developer from a photoresist development waste and reusing it; characterized by comprising a recovery and refining unit for separating impurities including photoresist from the photoresist development waste to recover a tetraalkylammonium hydroxide solution, a first rejuvenated developer adjustment unit for replenishing the recovered tetraalkylammonium hydroxide solution with (ultra)pure water and/or tetraalkylammonium hydroxide as needed to obtain a first rejuvenated developer having a desired tetraalkylammonium hydroxide concentration, a second rejuvenated developer adjustment unit for replenishing part of the photoresist development waste preferably treated with a cation exchange resin and/or chelate resin treatment unit and/or at least part of a photoresist-containing waste recovered from the recovery and refining unit and preferably treated with a cation exchange resin and/or chelate resin treatment unit with (ultra)pure water and/or tetraalkylammonium hydroxide as needed to obtain a second rejuvenated developer having a desired tetraalkylammonium hydroxide concentration, and a mixer for mixing the first rejuvenated developer with the second rejuvenated developer to prepare a mixed rejuvenated developer, which is fed to a development unit. Herein, the "recovery and refining unit" comprises at least one of units for use in various steps as mentioned hereinbefore in connection with the method of separating impurities such as photoresist from a development waste to recover a TAAH solution. Using this developer recovery and reuse equipment, a developer can be recirculated and reused in a factory.

This developer recovery and reuse equipment desirably further comprises flow meters for measuring the respective flow rates of the first and second rejuvenated developers, a photoresist concentration determination apparatus for the second rejuvenated developer, a photoresist concentration determination apparatus for the mixed rejuvenated developer, and a controller for controlling the respective flow rates of the first and second rejuvenated developers in such a manner that the photoresist concentration of the mixed rejuvenated developer becomes a desired value through operation of the measured values of flow rates and photoresist concentrations as input data. This enables automatic recirculation and reuse of the developer in a factory.

According to the present invention, as a suitable simple example of equipment for performing the process of the present invention, there is provided equipment for recovering a developer from a photoresist development waste and reusing it; characterized by comprising a rejuvenated developer adjustment unit comprising a development waste storage and rejuvenated developer adjustment tank, and a recovery and refining unit for separating impurities including photoresist from a solution sent from the development waste storage and rejuvenated developer adjustment tank to recover a tetraalkylammonium hydroxide solution, which is sent back to the development waste storage and rejuvenated developer adjustment tank and mixed with the solution in the development waste storage and rejuvenated developer adjustment tank, and optionally replenished with (ultra)pure water and/or tetraalkylammonium hydroxide as needed to prepare a rejuvenated developer, which is fed to a development unit. Herein, the "refining and recovery unit" comprises at least one of units for use in various steps as mentioned hereinbefore in connection with the method of separating impurities such as photoresist from the development waste to recover a TAAH solution. Using this developer recovery and reuse equipment, a developer can be recirculated and reused in a factory.

This developer recovery and reuse equipment desirably further comprises a circulation line attached to the rejuvenated developer adjustment unit and provided with a photoresist concentration determination apparatus for the solution in the development waste storage and rejuvenated developer adjustment tank and a TAAH concentration determination apparatus for the solution in the development waste storage and rejuvenated developer adjustment tank, and a controller for controlling to desired values the respective flow rates of at least part of the photoresist development waste preferably treated with a cation exchange resin and/or chelate resin treatment unit and the tetraalkylammonium hydroxide solution, and optionally at least part of a photoresist-containing waste recovered from the recovery and refining unit and preferably treated with a cation exchange resin and/or chelate resin treatment unit, and further optionally (ultra)pure water and/or TAAH (aqueous solution) through operation of the measured values of photoresist concentration and TAAH concentration as input data. This enables automatic recirculation and reuse of the developer in a factory.

BRIEF DESCRIPTION OF THE DRAWINGS

The foregoing objects, features and advantages of the present invention will be better understood from the following description taken in connection with the accompanying drawings, in which.

PREFERRED MODES FOR CARRYING OUT THE INVENTION

Preferred modes for carrying out the present invention will now be described while referring to FIGS. 1 to 8, but should not be construed as limiting the scope of the present invention. Additionally stated, in the following figures, the "TAAH recovery and refining unit" comprises a variety of unit(s) such as an electrodialysis unit and/or an electrolysis unit, an ion exchange treatment unit, a nanofilter, a chelate resin treatment unit, and/or the like, incorporated thereinto in accordance with the purpose.

Figure 1:
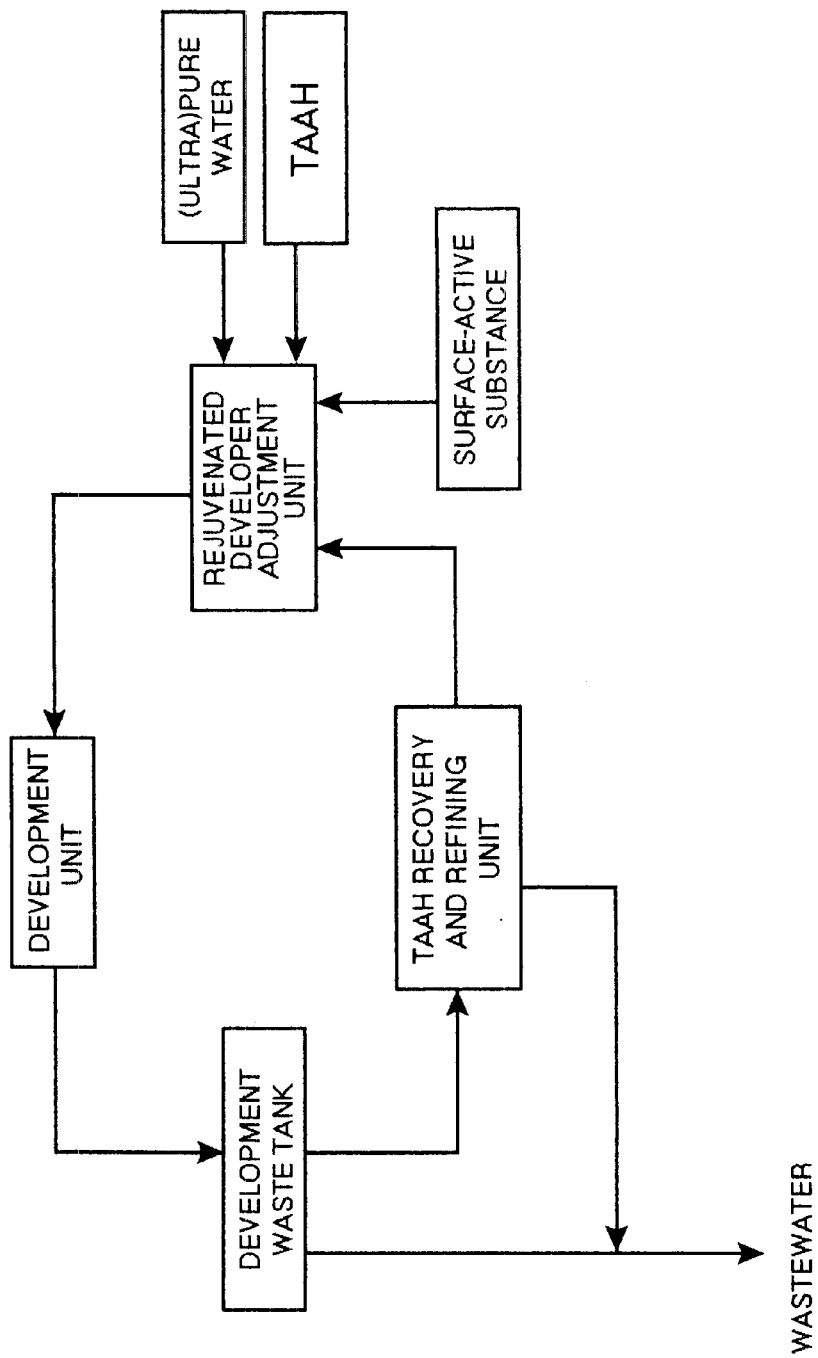
FIG. 1 is a block diagram of an example of basic equipment for carrying out the present invention.

FIG. 1 is a block diagram of an example of basic equipment for carrying out the present invention. A development waste from a development unit is once stored in a development waste tank if necessary, and then sent to a TAAH recovery and refining unit to obtain a recovered refined TAAH solution, which is then sent to a rejuvenated developer adjustment unit, wherein the TAAH solution is then mixed with a surface-active substance such as a surfactant, and replenished and mixed with (ultra)pure water and/or TAAH (aqueous solution) as needed for adjustment of its surface-active substance concentration and TAAH concentration to obtain a rejuvenated developer, which is then sent to the development unit, wherein it is reused in the development step. Incidentally, virgin TAAH aqueous solution) is usually used for replenishment, but a TAAH solution recovered and refined in any other step may instead be used. The excess waste (desalted solution in electrodialysis or electrolysis, NF concentrate in NF membrane treatment, or the like) from the TAAH recovery and refining unit is discharged as wastewater via a wastewater line sometimes together with the excess development waste from the development waste tank.

Figure 2:
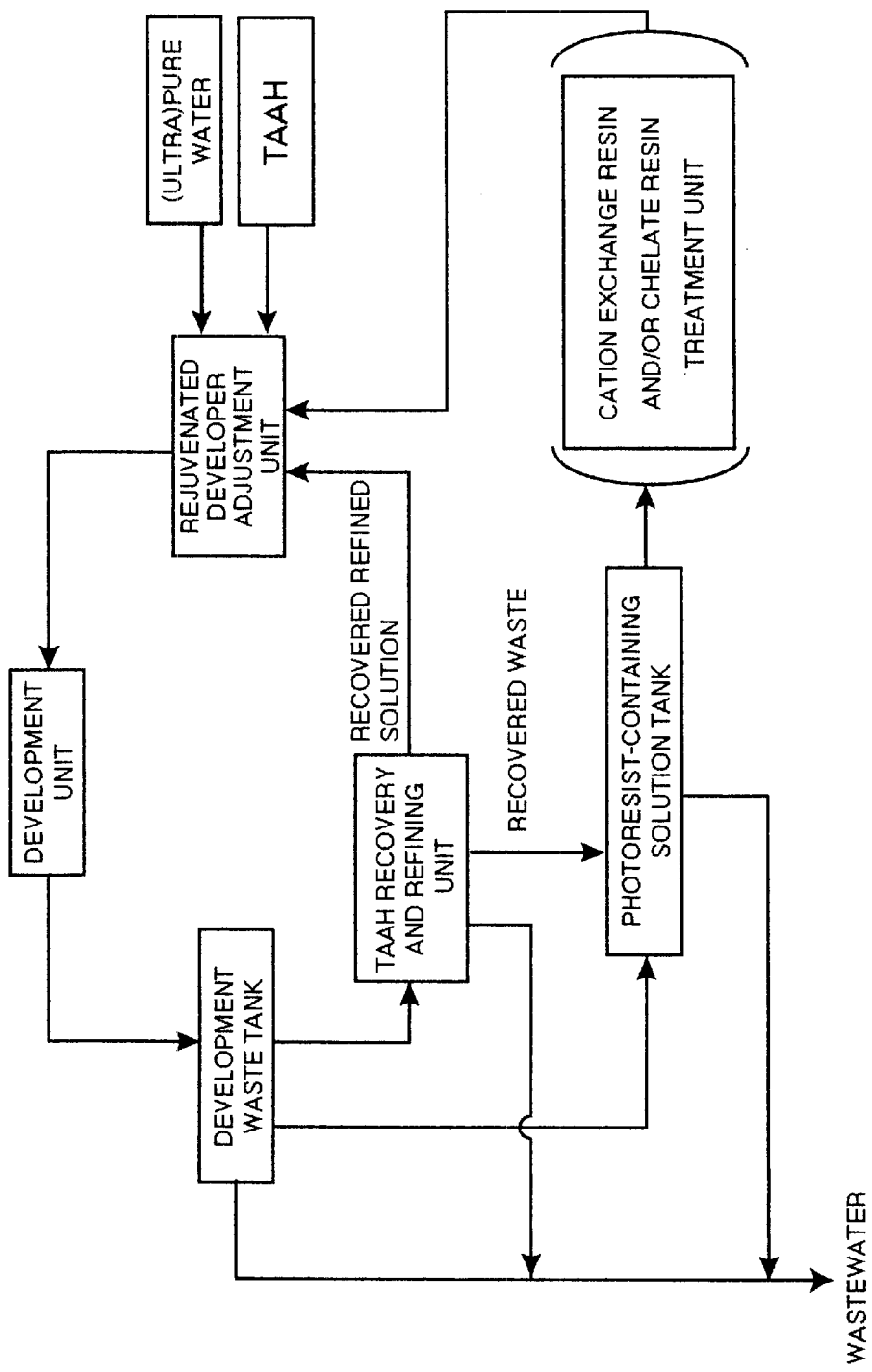
FIG. 2 is a block diagram of another example of basic equipment for carrying out the present invention.

FIG. 2 is a block diagram of another example of basic equipment for carrying out the present invention. A development waste from a development unit is once stored in a development waste tank if necessary, and part of it is then sent to a TAAH recovery and refining unit to obtain a recovered refined TAAH solution while sending other part of it to a photoresist-containing solution tank. If necessary, that other part of the development waste is mixed with at least part of a photoresist-containing waste (desalted solution in electrodialysis or electrolysis, NF concentrate in NF membrane treatment, or the like) recovered from the TAAH recovery and refining unit. Only the development waste or only the photoresist-containing waste recovered from the TAAH recovery and refining unit may alternatively be sent to the photoresist-containing solution tank. The photoresist-containing solution from the photoresist-containing solution tank is sent as a source of photoresist as a surface-active substance to a rejuvenated developer adjustment unit preferably via a cation exchange resin and/or chelate resin treatment unit, and then mixed there with the recovered refined TAAH solution from the TAAH recovery and refining unit, and replenished with (ultra)pure water and/or TAAH (aqueous solution) as needed for adjustment of the photoresist concentration and TAAH concentration of the mixture to obtain a rejuvenated developer, which is then sent to the development unit, wherein it is reused in the development step.

In FIG. 2, the "photoresist-containing solution tank" is provided if necessary, and may be dispensed with. Where the photoresist-containing solution tank is dispensed with, the development waste in the development waste tank or the waste recovered from the TAAH recovery and refining unit may be sent to the rejuvenated developer adjustment unit either directly or via the cation exchange resin and/or chelate resin treatment unit. Virgin TAAH (aqueous solution) is usually used for replenishment, but a TAAH solution recovered and refined in any other step may instead be used. The excess waste (desalted solution in electrodialysis or electrolysis, NF concentrate in NF membrane treatment, or the like) from the TAAH recovery and refining unit is discharged as wastewater via a wastewater line sometimes together with the excess development waste from the development waste tank and/or the excess photoresist-containing solution from the photoresist-containing solution tank.

Figure 3:
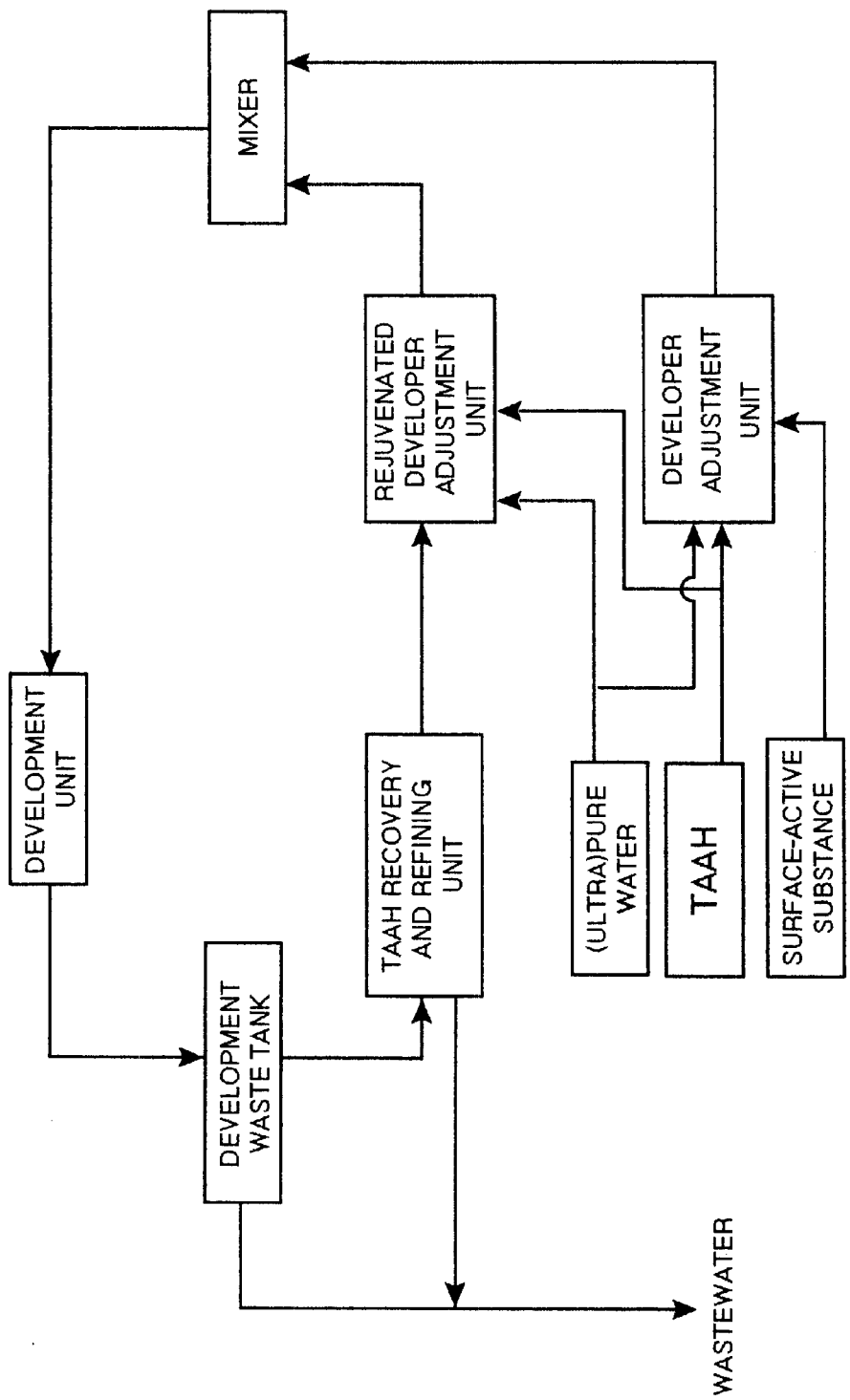
FIG. 3 is a block diagram of still another example of basic equipment for carrying out the present invention.

FIG. 3 is a block diagram of still another example of basic equipment for carrying out the present invention. A development waste from a development unit is once stored in a development waste tank if necessary, and then sent to a TAAH recovery and refining unit to obtain a recovered refined TAAH solution, which is then sent to a rejuvenated developer adjustment unit, wherein the solution is replenished and mixed with (ultra)pure water and/or TAAH (aqueous solution) as needed for adjustment of its TAAH concentration to a desired one (about 2.4 wt. % in the case of TMAH) to obtain a rejuvenated developer. On the other hand, (ultra)pure water and TAAH (aqueous solution) are mixed with a surface-active substance such as a surfactant in a developer adjustment unit to obtain a virgin developer having its TAAH concentration adjusted to a desired one (about 2.4 wt. % in the case of TMAH). The rejuvenated developer and the virgin developer are sent to a mixer, wherein they are mixed to obtain an adjusted developer having a desired surface-active substance concentration, which is then sent to a development unit, wherein it is used in the development step. Virgin TAAH (aqueous solution) is usually used for replenishment, but a TAAH solution recovered and refined in any other step may instead be used. The excess waste (desalted solution in electrodialysis or electrolysis, NF concentrate in NF membrane treatment, or the like) from the TAAH recovery and refining unit is discharged as wastewater via a wastewater line sometimes together with the excess development waste from the development waste tank.

Figure 4:
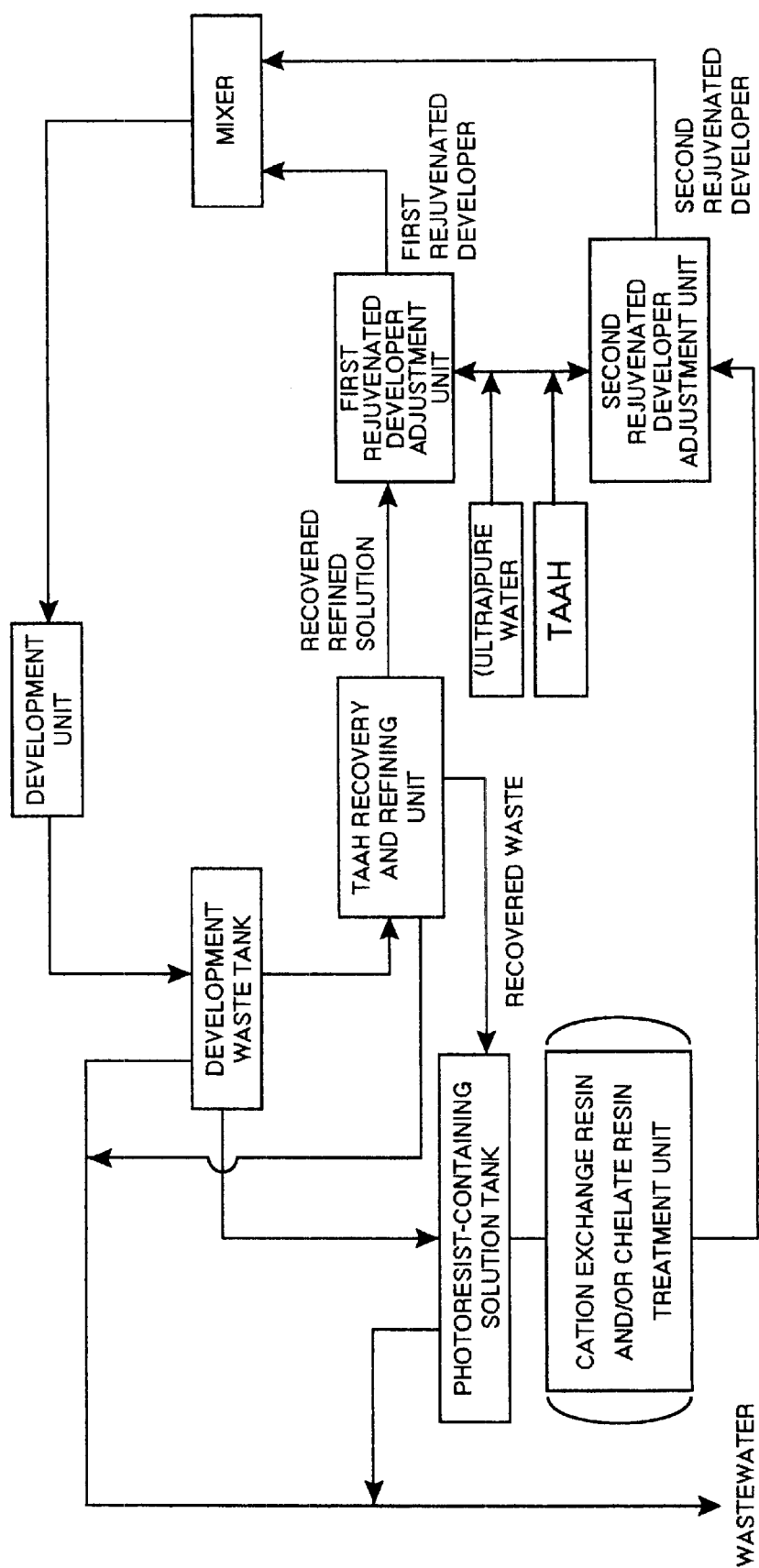
FIG. 4 is a block diagram of a further example of basic equipment for carrying out the present invention.

FIG. 4 is a block diagram of a further example of basic equipment for carrying out the present invention. A development waste from a development unit is once stored in a development waste tank if necessary, and part of it is then sent to a TAAH recovery and refining unit while sending other part of it to a photoresist-containing solution tank. If necessary, that other part of the development waste is mixed with at least part of a photoresist-containing waste (desalted solution in electrodialysis or electrolysis, NF concentrate in NF membrane treatment, or the like) recovered from the TAAH recovery and refining unit. Only the development waste or only the photoresist-containing waste recovered from the TAAH recovery and refining unit may alternatively be sent to the photoresist-containing solution tank. The photoresist-containing solution from the photoresist-containing solution tank is sent as a source of photoresist as a surface-active substance to a second rejuvenated developer adjustment unit preferably via a cation exchange resin and/or chelate resin treatment unit, and replenished and mixed with (ultra)pure water and/or TAAH (aqueous solution) as needed for adjustment of its TAAH concentration to a desired one (about 2.4 wt. % in the case of TMAH) to obtain a second rejuvenated developer containing the photoresist. On the other hand, a recovered refined TAAH solution obtained from the TAAH recovery and refining unit is sent to a first rejuvenated developer adjustment unit, wherein it is then replenished and mixed with (ultra)pure water and/or TAAH (aqueous solution) as needed for adjustment of its TAAH concentration to a desired one (about 2.4 wt. % in the case of TMAH) to obtain a first rejuvenated developer. The first and second rejuvenated developers are sent to a mixer, wherein they are then mixed to obtain a mixed rejuvenated developer having a desired photoresist concentration, which is then sent to a development unit, wherein it is reused in the development step. Incidentally, the photoresistcontaining solution tank is provided if necessary, and may be dispensed with like in FIG. 2. Virgin TAAH (aqueous solution) is usually used for replenishment, but a TAAH solution recovered and refined in any other step may instead be used. The excess waste (desalted solution in electrodialysis or electrolysis, NF concentrate in NF membrane treatment, or the like) from the TAAH recovery and refining unit is discharged as wastewater via a wastewater line sometimes together with the excess development waste from the development waste tank and/or the excess photoresist-containing solution from the photoresist-containing solution tank.

Figure 5:
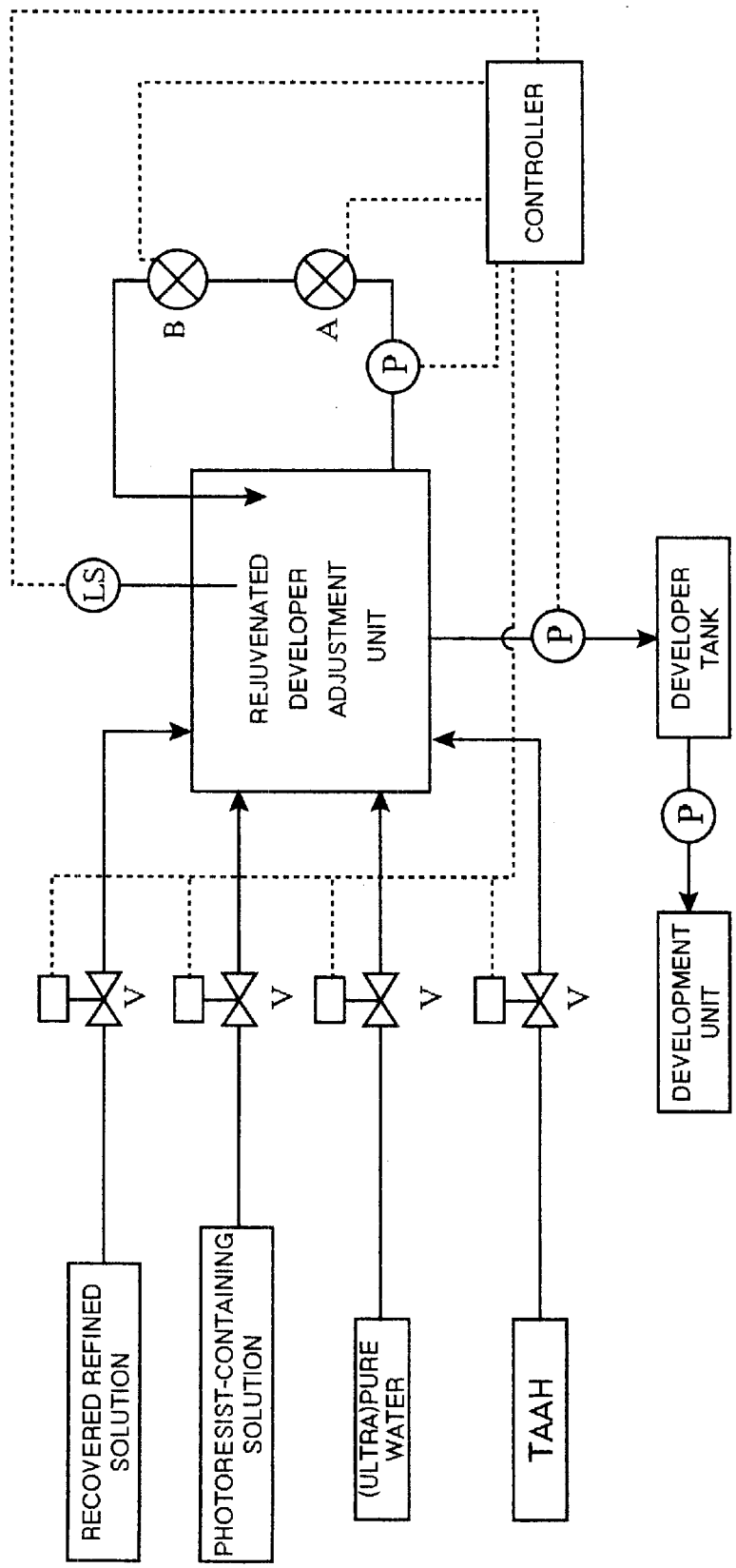
FIG. 5 is a flow diagram illustrating the constitution of an example of rejuvenated developer adjustment unit including a rejuvenated developer adjustment tank that may be used in carrying out the present invention.

FIG. 5 is a flow diagram illustrating the constitution of an example of rejuvenated developer adjustment unit including a rejuvenated developer adjustment tank that may be used in carrying out the present invention. This unit can favorably be incorporated into, e.g., the basic equipment (system) of FIG. 2. A recovered and refined TAAH-containing solution, a photoresist-containing solution preferably treated with a cation exchange resin and/or a chelate resin, (ultra)pure water, and TAAH (aqueous solution) are fed via respective automatic control valves V to the rejuvenated developer adjustment tank, which is provided with a level sensor LS for detecting the level of the solution surface. A circulation line equipped with a photoresist concentration determination apparatus A such as an absorptiometer and a TAAH concentration determination apparatus B such as a conductivity meter or an ultrasonic concentration meter is attached to the rejuvenated developer adjustment tank to measure the photoresist and TAAH concentrations of the rejuvenated developer in the rejuvenated developer adjustment tank. This circulation line may have a function of agitating the rejuvenated developer. The detected value of the level of the solution surface, and the measured values of the photoresist and TAAH concentrations are inputted to a controller. Based on the inputted values, the controller outputs signals for controlling the respective automatic control valves V and pumps P. In FIG. 5, control lines are expressed by broken lines. The rejuvenated developer thus adjusted is once sent to and stored in a developer tank if necessary, and then sent to a development unit for reuse thereof.

Figure 6:
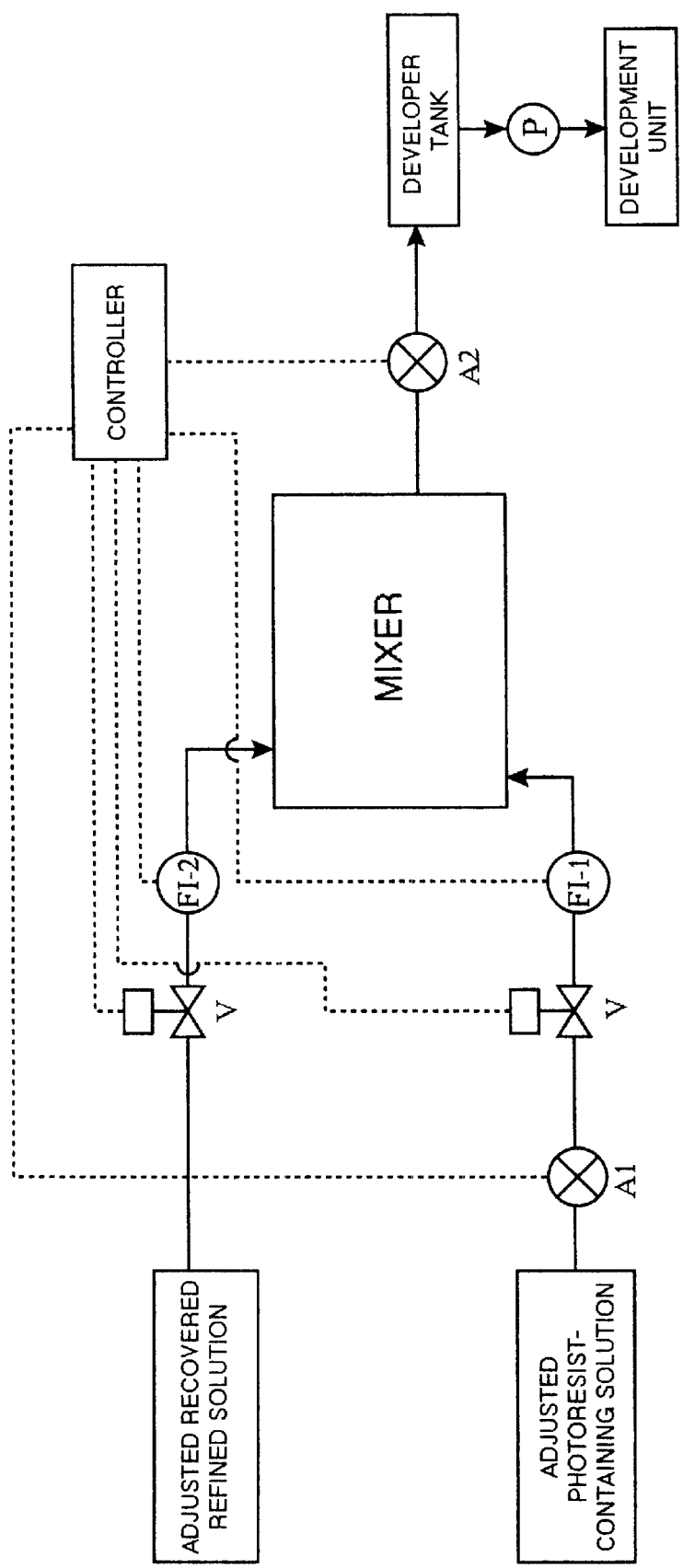
FIG. 6 is a flow diagram illustrating the constitution of an example of rejuvenated developer adjustment unit including a mixer for rejuvenated developer adjustment that may be used in carrying out the present invention.

FIG. 6 is a flow diagram illustrating the constitution of an example of rejuvenated developer adjustment unit including a mixer for rejuvenated developer adjustment that may be used in carrying out the present invention. This unit can favorably be incorporated into, e.g., the basic equipment (system) of FIG. 4. The mixer is fed via respective automatic control valves V with a recovered refined solution (corresponding to the first rejuvenated developer in the description of FIG. 4) adjusted to a desired TAAH concentration (about 2.4 wt. % in the case of TMAH), and a photoresist-containing TAAH solution (corresponding to the second rejuvenated developer in the description of FIG. 4) adjusted to a desired TAAH concentration (about 2.4 wt. % in the case of TMAH) by adding (ultra)pure water and TAAH (aqueous solution) as needed to a photoresist-containing solution preferably treated with a cation exchange resin and/or a chelate resin. The photoresist concentration and flow rate of the adjusted photoresist-containing TAAH solution are measured with a photoresist concentration determination apparatus A1 such as an absorptiometer and a flow indicator FI-1 to input the measured values to a controller. On the other hand, the flow rate of the adjusted recovered refined solution is measured with a flow indicator FI-2 to input the measured value to the controller. The photoresist concentration of the rejuvenated developer obtained from the mixer is measured with a photoresist concentration determination apparatus A2 such as an absorptiometer to input the measured value to the controller. The controller, to which the measured values have been inputted, controls flow rate control valves V respectively attached to an adjusted recovered refined solution line and an adjusted photoresist-containing TAAH solution line to control the photoresist concentration of the rejuvenated developer to a desired value. In FIG. 6, control lines are expressed by broken lines, and a pump is denoted by P. The rejuvenated developer thus adjusted is once sent to and stored in a developer tank if necessary, and sent to a development unit for reuse thereof.

Incidentally, although a pump is used as a means for sending the developer from the developer tank to the development unit in the foregoing embodiments of FIGS. 5 and 6, the developer tank may alternatively be pressurized with $N_2$ gas or the like to send the developer without using the pump. In FIGS. 5 and 6, the developer tank is provided if necessary, and may be dispensed with.

Figure 7:
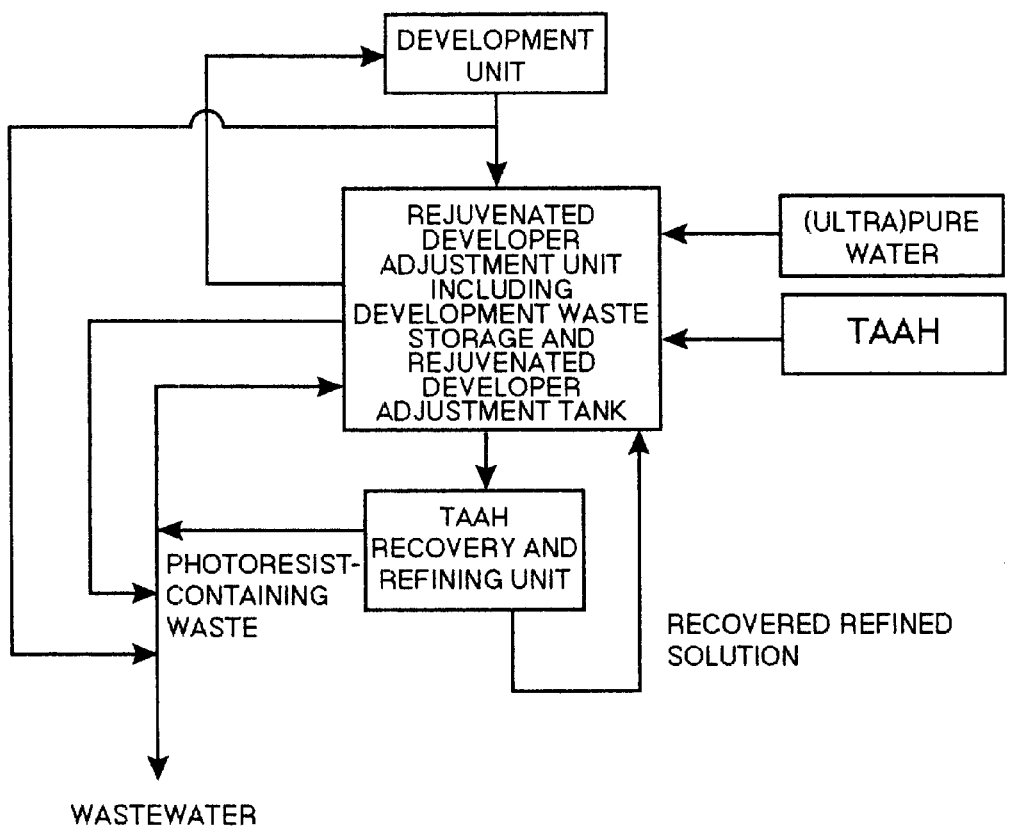
FIG. 7 is a block diagram of an example of basic and simple equipment for carrying out the present invention.

FIG. 7 is a block diagram of an example of basic simple equipment for carrying out the present invention. At least part of a development waste from a development unit is sent to the development waste storage and rejuvenated developer adjustment tank of a rejuvenated developer adjustment unit, from which part of the solution is sent to a TAAH recovery and refining unit. In passing, when an excess of development waste is generated, or when the development waste has a low TAAH concentration, it may be directly discharged as wastewater via a wastewater line, which is, however, not always necessary. A recovered and refined TAAH solution from the TAAH recovery and refining unit may be returned back to the development waste storage and rejuvenated developer adjustment tank, which is supplied with (ultra) pure water and/or TAAH (aqueous solution) as needed for photoresist and TAAH concentrations adjustment to adjust the solution in the tank to a rejuvenated developer, which is then sent to the development unit, wherein it is reused in the development step. At least part of the photoresist-containing waste (e.g., desalted solution in electrodialysis or electrolysis, NF concentrate in NF membrane treatment, or the like) recovered from the TAAH recovery and refining unit may be returned back to the development waste storage and rejuvenated developer adjustment tank preferably via a cation exchange resin and/or chelate resin treatment unit (not shown in the figure). Since the photoresist-containing development waste as a source of surface-active substance flows directly into the development waste storage and rejuvenated developer adjustment tank, however, the foregoing mode may not necessarily be adopted, and the photoresist-containing waste recovered from the TAAH recovery and refining unit may simply be discharged as wastewater via a wastewater line. At a necessary time or if necessary, the excess solution from the development waste storage and rejuvenated developer adjustment tank may be discharged as wastewater via the wastewater line.

Figure 8:
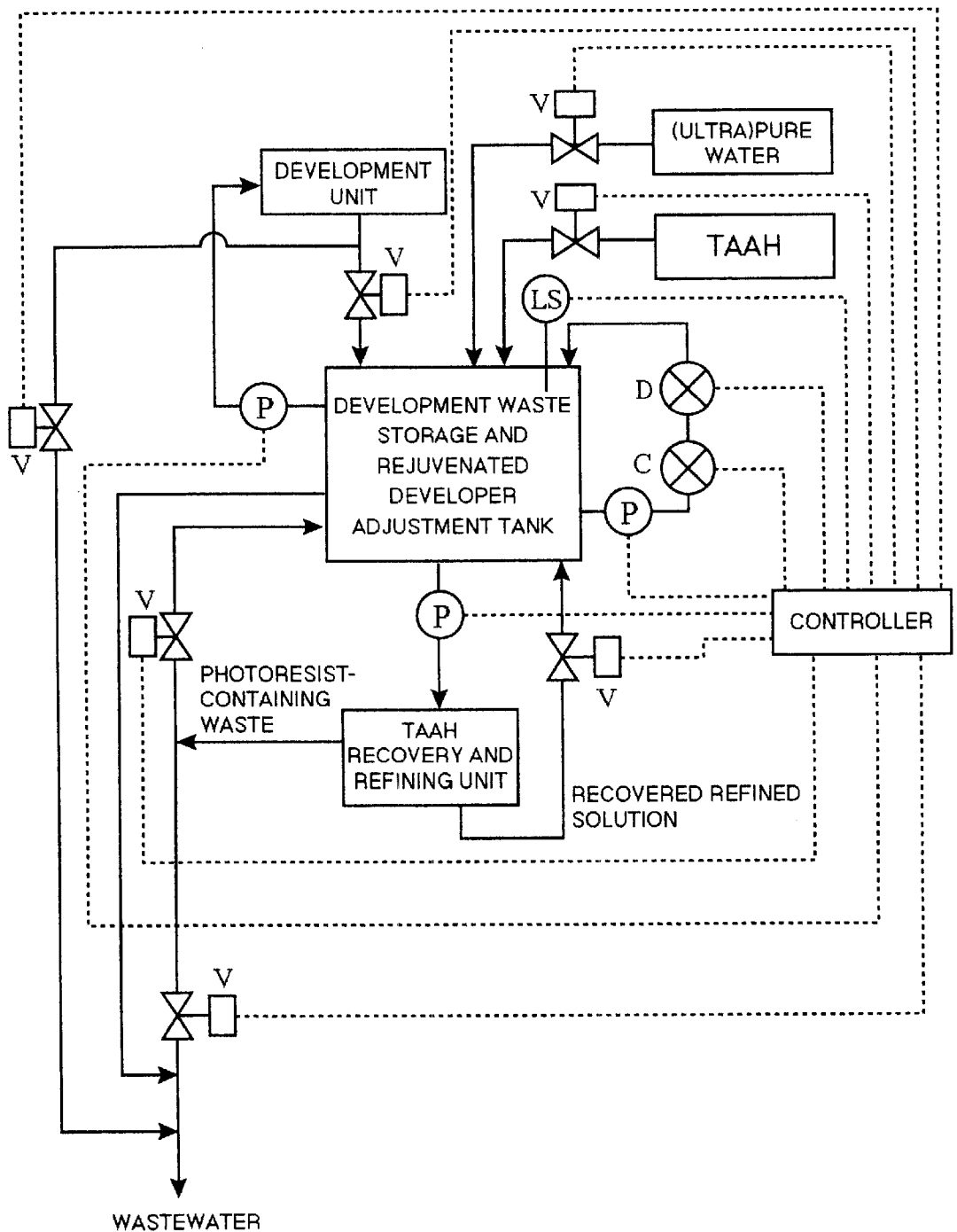
FIG. 8 is a flow diagram illustrating an automatized example of the basic equipment of FIG. 7.
Figure 9:
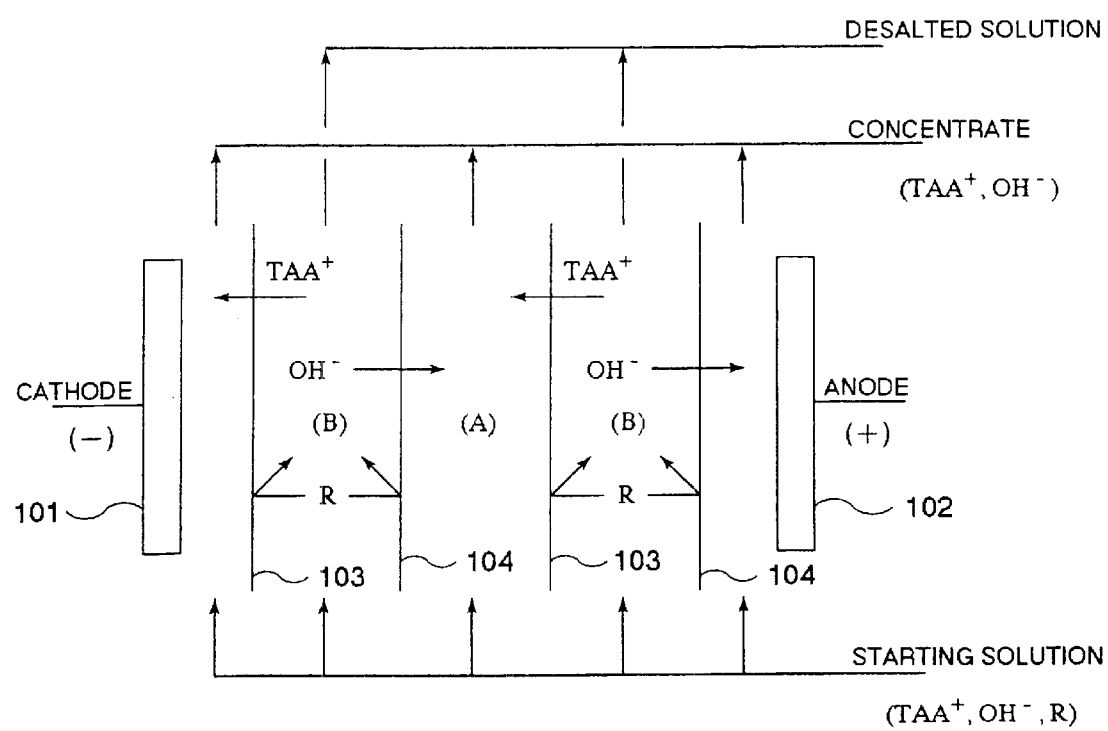
FIG. 9 is an illustration showing the principle of electrodialysis that may be done in the process of the present invention.
Figure 10:
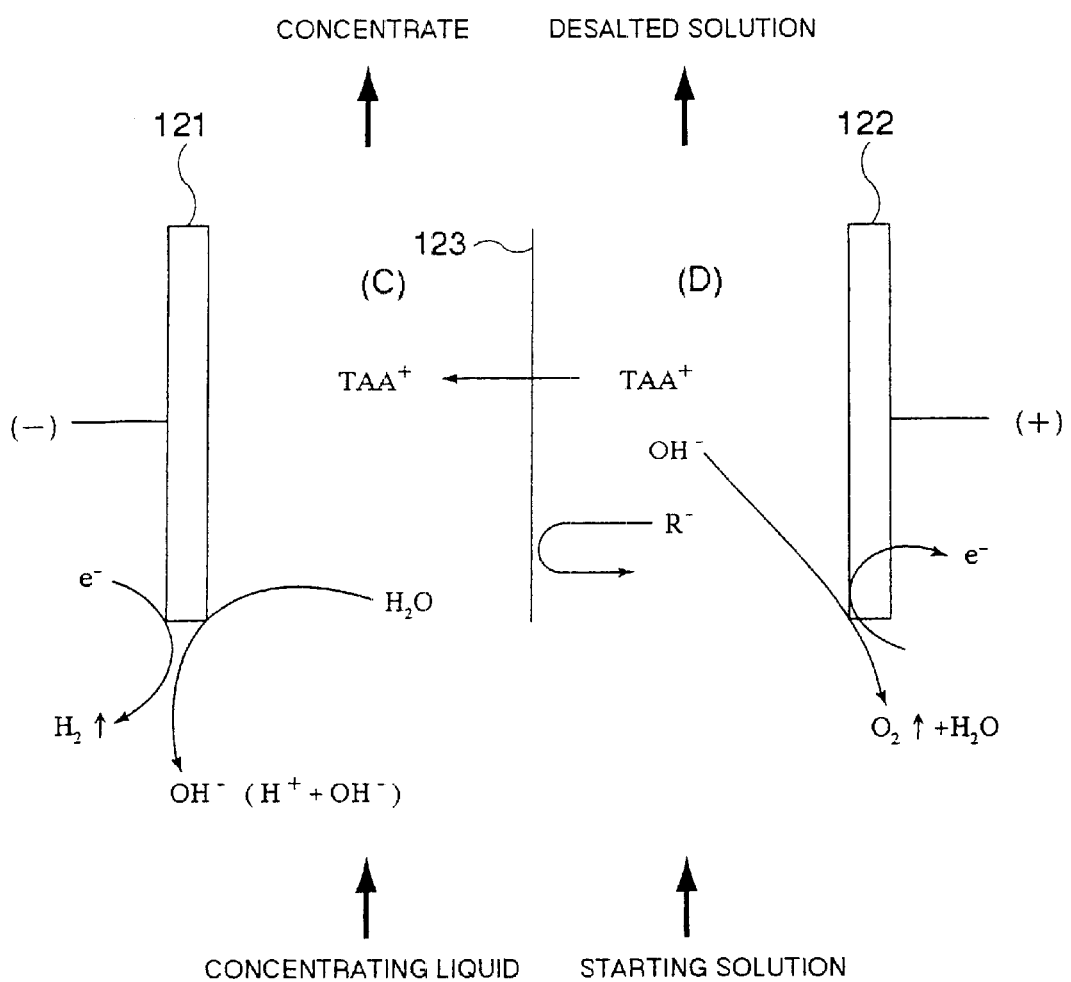
FIG. 10 is an illustration showing the principle of electrolysis that may be done in the process of the present invention.

FIG. 8 is a flow diagram illustrating an automatized example of the basic equipment of FIG. 7. In the equipment of FIG. 8, a development waste storage and rejuvenated developer adjustment tank is fed with a development waste, a recovered refined TAAH-containing solution, (ultra)pure water and TAAH (aqueous solution) via respective automatic control valves V. If necessary, a photoresist-containing waste recovered from a TAAH recovery and refining unit and preferably treated with a cation exchange resin and/or a chelate resin (not shown in the figure) may be returned back to the development waste storage and rejuvenated developer adjustment tank via an automatic control valve V for it. The development waste storage and rejuvenated developer adjustment tank is provided with a level sensor LS for detecting the level of the solution surface. A circulation line equipped with a photoresist concentration determination apparatus C such as an absorptiometer and a TAAH concentration determination apparatus D such as a conductivity meter or an ultrasonic concentration meter is attached to the development waste storage and rejuvenated developer adjustment tank to measure the photoresist and TAAH concentrations of the solution in the development waste storage and rejuvenated developer adjustment tank. This circulation line may have a function of agitating the rejuvenated developer. The detected value of the level of the solution surface, and the measured values of the photoresist and TAAH concentrations are inputted to a controller. Based on the inputted values, the controller outputs signals for controlling the respective automatic control valves V and pumps P. In FIG. 8, control lines are expressed by broken lines. Any redundant explanations are dispensed with because others are the same as described in connection with FIG. 7.

EXAMPLES

The following Examples will specifically illustrate the present invention, but should not be construed as limiting the scope of the present invention. In the following Examples, the TMAH concentration was analyzed according to ion-exchange chromatography, the photoresist concentration was measured according to absorptiometry while using an ultraviolet-visible light absorptiometer [the measured absorbance at 290 nm (absorption being assigned to photoresist) was mentioned as such], and the Na concentration was measured according to atomic absorption spectrometry.

Example 1

TMAH was recovered and refined with an electrodialyzer and an ion exchange treatment unit (mixed bed) from a photoresist development waste discharged from an LCD production process. The water quality of this development waste involved a TMAH concentration of 8,600 mg/l, an absorbance at 290 nm of 3.48 and an Na concentration of 510 μg/l.

TMAH in this development waste as a starting solution was separated, concentrated and recovered into ultrapure water (concentrating liquid) with the electrodialyzer according to a circulation method to obtain a recovered solution. MICRO ACILYZER (registered trademark) G3 manufactured by Asahi Chemical Industry Co., Ltd. was used as the electrodialyzer, wherein use was made of cation exchange membranes ACIPLEX K-501 manufactured by Asahi Chemical Industry Co., Ltd., neutral membranes ACIPLEX PVA #100 manufactured by Asahi Chemical Industry Co., Ltd. instead of anion exchange membranes, and platinum-plated titanium electrodes as both the anode and the cathode.

The recovered solution was then passed through a column packed, in the form of a mixed bed, with a cation exchange resin AMBERLITE 200C (manufactured by Rohm and Haas Company) preliminarily converted into the TMA form (tetramethylammonium ion form) by passing therethrough a virgin aqueous TMAH solution and a strongly basic anion exchange resin AMBERLITE IRA-900 (manufactured by Rohm and Haas Company) in the OH form, whereby it was refined to obtain a TMAH solution having a TMAH concentration of 22,700 ppm, an absorbance at 290 nm of less than 0.01, and an Na concentration of less than 10 ppb, to which a semiconductor grade 25 wt. % TMAH reagent containing no surfactants was then added to obtain a TMAH concentration-adjusted solution having a TMAH concentration of 23,800 ppm, an absorbance at 290 nm of less than 0.01, and an Na concentration of less than 10 ppb.

On the other hand, the development waste was passed through a column packed with a cation exchange resin AMBERLITE 200C preliminarily converted into the TMA form to effect ion exchange treatment, and then admixed with a semiconductor grade 25 wt. % TMAH reagent containing no surfactants to obtain a photoresist-containing treated solution having a TMAH concentration of 23,800 ppm, an absorbance at 290 nm of 3.25, and an Na concentration of less than 10 ppb.

The TMAH concentration-adjusted solution and the photoresist-containing treated solution, obtained by the foregoing respective procedures, were mixed with each other at a proper proportion to obtain a photoresist concentration-adjusted mixed solution.

Each of a virgin TMAH solution containing no surfactants, the TMAH concentration-adjusted solution and the photoresist concentration-adjusted adjusted mixed solution was dropped on a photoresist coating film formed on a glass plate to measure the contact angle therebetween one minute after dropping. The results are shown in Table 1, wherein "Virgin Solution" refers to the virgin TMAH solution, "Adjusted Solution" to the TMAH concentration-adjusted solution, "Mixed Solution" to the photoresist concentration-adjusted mixed solution, "TMAH" to the TMAH wt. percentage, and "Absorbance" to a value of absorbance measured at 290 nm using the ultraviolet-visible light absorptiometer.

TABLE 1

| Solution | TMAH | Absorbance | Contact Angle (°) |
| --- | --- | --- | --- |
| Mixed Solution 1 | 2.38 | 3.0 | 35 |
| Mixed Solution 2 | 2.38 | 2.0 | 37 |
| Adjusted Solution | 2.38 | 0.0 | 39 |
| Virgin Solution | 2.38 | 0.0 | 39 |

Table 1 demonstrates that the higher the photoresist concentration (the higher the absorbance at 290 nm), the lower the contact angle of the mixed solution (rejuvenated developer) with the photoresist coating film, because the dissolved photoresist contained in the development waste had a surface-active effect. This makes it understandable that a rejuvenated developer having an arbitrary surface tension can be obtained by adding the photoresist as a surface-active substance to a recovered TMAH solution to adjust the photoresist concentration thereof.

According to the present invention, a surface-active substance such as a surfactant or a dissolved photoresist contained in a development waste is mixed with a TAAH solution recovered from the development waste to properly adjust the surface-active substance concentration thereof, whereby a rejuvenated developer having an arbitrary surface tension can be obtained. Thus, a rejuvenated developer suitable for a variety of development step can be recovered from a development waste, and reused therein.

In rejuvenation treatment of a photoresist development waste for the purpose of obtaining a rejuvenated developer for use in production of, e.g., electronic parts such as semiconductor devices, liquid crystal displays or printed boards, wherein impurities must particularly be avoided, refining treatment steps such as NF membrane separation treatment, electrodialysis and/or electrolysis, ion exchange treatment, and chelate resin contact treatment steps may be properly combined to recover a TAAH solution, which is then mixed with a source of surface-active substance such as a surfactant, a development waste, a photoresist-containing treated solution thereof obtained in NF membrane separation treatment, electrodialysis and/or electrolysis or the like step, or a refined photoresist-containing solution thereof obtained through any refining treatment as needed, whereby a rejuvenated developer having a desired surface tension can be recovered and reused in the development step.

The entire disclosure of Japanese Patent Application No. 10-309606 filed on Oct. 30, 1998 including specification, claims, drawings and summary is incorporated herein by reference in its entirety.

What is claimed is:

1. Equipment for recovering a developer from a photoresist development waste and reusing it; comprising a source of photoresist development waste including tetraalkylammonium hydroxide; a recovery and refining unit for separating impurities including photoresist from a photoresist development waste to recover tetraalkylammonium hydroxide solution, a rejuvenated developer adjustment unit operable for mixing said tetraalkylammonium hydroxide solution recovered from said recovery and refining unit with at least one of part of the photoresist development waste and at least part of a photoresist-containing waste recovered from said recovery and refining unit to obtain a rejuvenated developer, and a development unit arranged to be fed with said rejuvenated developer.

2. Equipment for recovering a developer from a photoresist development waste and reusing it as claimed in claim 1; which further comprises a circulation line attached to said rejuvenated developer adjustment unit and provided with a photoresist concentration determination apparatus for the rejuvenated developer and a tetraalkylammonium hydroxide concentration determination apparatus for the rejuvenated developer, and a controller for controlling to desired values the flow rates of the recovered tetraalkylammonium hydroxide solution, at least one of part of the photoresist development waste and at least part of the photoresist-containing waste recovered from said recovery and refining unit, and at least one of pure or ultrapure water and tetraalkylamonium hydroxide through operation of the measured values of photoresist concentration and tetraalkylammonium hydroxide concentration as input data.

3. Equipment for recovering a developer from a photoresist development waste and reusing it as claimed in claim 1; wherein said rejuvenated developer adjustment unit is further provided with at least one of a pure or ultrapure water addition line and a tetraalkylammonium hydroxide addition line for replenishing said tetraalkylamonium hydroxide solution and at least one of part of the photoresist development waste and at least part of the photoresist-containing waste with at least one of pure or ultrapure water and tetraalkylammonium hydroxide.

4. Equipment for recovering a developer from a photoresist development waste and reusing it as claimed in claim 1; which further comprises at least one of a cation exchange resin treatment unit and a chelate resin treatment unit, or a cation exchange resin and chelate resin mixed bed treatment unit for treating said part of the photoresist development waste with said at least one of the cation exchange resin treatment unit and the chelate resin treatment unit, or said cation exchange resin and chelate resin mixed bed treatment unit.

5. Equipment for recovering a developer from a photoresist development waste and reusing it as claimed in claim 1; which further comprises at least one of a cation exchange resin treatment unit and a chelate resin treatment unit, or a cation exchange resin and chelate resin mixed bed treatment unit for treating said at least part of the photoresist-containing waste with said at least one of the cation exchange resin treatment unit and the chelate resin treatment unit, or said cation exchange resin and chelate resin mixed bed treatment unit.

6. Equipment for recovering a developer from a photoresist development waste and reusing it; comprising a source of photoresist development waste including tetraalkylammonium hydroxide; a recovery and refining unit for separating impurities including photoresist from a photoresist development waste to recover tetraalkylammonium hydroxide solution, a first rejuvenated developer adjustment unit operable for replenishing the recovered tetraalkylammonium hydroxide solution with at least one of pure or ultrapure water and tetraalkylammonium hydroxide as needed to obtain a first rejuvenated developer having a desired tetraalkylammonium hydroxide concentration, a second rejuvenated developer adjustment unit operable for replenishing at least one of part of the photoresist development waste and at least part of a photoresist-containing waste recovered from said recovery and refining unit with at least one of pure or ultrapure water and tetraalkylammonium hydroxide as needed to obtain a second rejuvenated developer having a desired tetraalkylammonium hydroxide concentration, a mixer for mixing the first rejuvenated developer with the second rejuvenated developer to prepare a mixed rejuvenated developer, and a development unit arranged to be fed with said mixed rejuvenated developer.

7. Equipment for recovering a developer from a photoresist development waste and reusing it as claimed in claim 6; which further comprises flow meters for measuring the respective flow rates of the first rejuvenated developer and the second rejuvenated developer, a photoresist concentration determination apparatus for the second rejuvenated developer, a photoresist concentration determination apparatus for the mixed rejuvenated developer, and a controller for controlling the respective flow rates of the first rejuvenated developer and the second rejuvenated developer in such a manner that the photoresist concentration of the mixed rejuvenated developer becomes a desired value through operation of the measured values of flow rates and photoresist concentrations as input data.

8. Equipment for recovering a developer from a photoresist development waste and reusing it as claimed in claim 6; which further comprises at least one of a cation exchange resin treatment unit and a chelate resin treatment unit, or a cation exchange resin and chelate resin mixed bed treatment unit for treating said part of the photoresist development waste with said at least one of the cation exchange resin treatment unit and the chelate resin treatment unit, or said cation exchange resin and chelate resin mixed bed treatment unit.

9. Equipment for recovering a developer from a photoresist development waste and reusing it as claimed in claim 6; which further comprises at least one of a cation exchange resin treatment unit and a chelate resin treatment unit, or a cation exchange resin and chelate resin mixed bed treatment unit for treating said at least part of the photoresist-containing waste with said at least one of the cation exchange resin treatment unit and the chelate resin treatment unit, or said cation exchange resin and chelate resin mixed bed treatment unit.

10. Equipment for recovering a developer from a photoresist development waste and reusing it; comprising a source of photoresist development waste including tetraalkylammonium hydroxide; a rejuvenated developer adjustment unit comprising a development waste storage and rejuvenated developer adjustment tank, a recovery and refining unit operable for separating impurities including photoresist from a solution sent from said development waste storage and rejuvenated developer adjustment tank to recover a tetraalkylammonium hydroxide solution, means for returning said recovered solution to said development waste storage and rejuvenated developer adjustment tank and mixing it with the solution in said development waste storage and rejuvenated developer adjustment tank to prepare a rejuvenated developer, and a development unit arranged to be fed with said rejuvenated developer.

11. Equipment for recovering a developer from a photoresist development waste and reusing it as claimed in claim 10; which further comprises a circulation line attached to said rejuvenated developer adjustment unit and provided with a photoresist concentration determination apparatus for the solution in said development waste storage and rejuvenated developer adjustment tank and a tetraalkylammonium hydroxide concentration determination apparatus for the solution in said development waste storage and rejuvenated developer adjustment tank, and a controller for controlling to desired values the respective flow rates of at least part of the photoresist development waste and the tetraalkylammonium hydroxide solution through operation of the measured values of photoresist concentration and tetraalkylammonium hydroxide concentration as input data.

12. Equipment for recovering a developer from a photoresist development waste and reusing it as claimed in claim

10; which further comprises at least one of a pure or ultrapure water addition line and a tetraalkylammonium hydroxide addition line for replenishing the recovered tetraalkylammonium hydroxide solution with at least one of pure or ultrapure water and tetraalkylammonium hydroxide as needed.

13. Equipment for recovering a developer from a photoresist development waste and reusing it as claimed in claim 12; wherein said controller is further used for controlling to a desired value the flow rate of at least one of pure or ultrapure water and tetraalkylammonium hydroxide, said flow rate being controlled before said development waste storage and rejuvenated developer adjustment tank.

14. Equipment for recovering a developer from a photoresist development waste and reusing it as claimed in claim 10; which further comprises a photoresist-containing waste recovery line for recovering a photoresist-containing waste from said recovery and refining unit and returning back at least part of said photoresist-containing waste to said development waste storage and rejuvenated developer adjustment tank.

15. Equipment for recovering a developer from a photoresist development waste and reusing it as claimed in claim 14; wherein said controller is further used for controlling to a desired value the flow rate of at least part of the photoresist-containing waste recovered from said recovery and refining unit, said flow rate being controlled before said development waste storage and rejuvenated developer adjustment tank.

16. Equipment for recovering a developer from a photoresist development waste and reusing it as claimed in claim 14; which further comprises at least one of a cation exchange resin treatment unit and a chelate resin treatment unit, or a cation exchange resin and chelate resin mixed bed treatment unit for treating said at least part of the photoresist-containing waste with said at least one of the cation exchange resin treatment unit and the chelate resin treatment unit, or said cation exchange resin and chelate resin mixed bed treatment unit.

* * * * *

UNITED STATES PATENT AND TRADEMARK OFFICE
CERTIFICATE OF CORRECTION

PATENT NO. : 6,488,847 B2
DATED : December 3, 2002
INVENTOR(S) : Hiroshi Sugawara It is certified that error appears in the above-identified patent and that said Letters Patent is hereby corrected as shown below:

Column 1,
Line 12, "covering" should be -- recovering --.

Column 3,
Lines 64-65, "surfaceactive" should be -- surface-active --.

Column 13,
Line 37, "TAMH" should be -- TAAH --.

Column 18,
Line 56, "aqueous" should be -- (aqueous --.

Column 20,
Line 39, "photoresistcontaining" should be -- photoresist-containing --.

Signed and Sealed this

Thirtieth Day of March, 2004

JON W. DUDAS
*Acting Director of the United States Patent and Trademark Office*